(12) United States Patent
Wada et al.

(10) Patent No.: US 9,190,299 B2
(45) Date of Patent: Nov. 17, 2015

(54) APPARATUS FOR MANUFACTURING SEMICONDUCTOR DEVICE, METHOD OF MANUFACTURING SEMICONDUCTOR DEVICE, AND RECORDING MEDIUM

(71) Applicant: Hitachi Kokusai Electric Inc., Tokyo (JP)

(72) Inventors: Yuichi Wada, Toyama (JP); Harunobu Sakuma, Toyama (JP); Hiroshi Ashihara, Toyama (JP); Hideto Tateno, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/283,593

(22) Filed: May 21, 2014

(65) Prior Publication Data

US 2014/0256160 A1 Sep. 11, 2014

Related U.S. Application Data

(63) Continuation of application No. PCT/JP2012/080072, filed on Nov. 20, 2012.

(30) Foreign Application Priority Data

Nov. 21, 2011 (JP) ................................. 2011-254184

(51) Int. Cl.
*H01L 21/67* (2006.01)
*H01L 21/02* (2006.01)
*C23C 16/455* (2006.01)
*C23C 16/458* (2006.01)

(52) U.S. Cl.
CPC ...... *H01L 21/67017* (2013.01); *C23C 16/4584* (2013.01); *C23C 16/45578* (2013.01); *H01L 21/0262* (2013.01); *H01L 21/02238* (2013.01)

(58) Field of Classification Search
CPC ..................... A61M 2205/0238; C23C 16/045; C23C 16/402; H01L 21/02164; H01L 21/68707; H01L 21/0228; H01L 21/02337
See application file for complete search history.

(56) References Cited

U.S. PATENT DOCUMENTS

| 7,955,948 | B2 | 6/2011 | Ohashi et al. |
| 2009/0004801 | A1* | 1/2009 | Ahn et al. ...................... 438/287 |
| 2012/0060752 | A1* | 3/2012 | Kiyotoshi et al. .............. 118/52 |

FOREIGN PATENT DOCUMENTS

| JP | 2001230246 A | 8/2001 |
| JP | 2004332033 A | 11/2004 |
| JP | 2009500857 A | 1/2009 |
| JP | 2010087475 A | 4/2010 |
| WO | 2005063685 A1 | 7/2005 |

OTHER PUBLICATIONS

International Search Report in counterpart International Application No. PCT/JP2012/080072, mailed Jan. 8, 2013.

* cited by examiner

*Primary Examiner* — Khaja Ahmad
(74) *Attorney, Agent, or Firm* — Edell, Shapiro & Finnan LLC

(57) ABSTRACT

An apparatus for manufacturing semiconductor devices is provided with a processing liquid supply part for supplying processing liquid into a processing chamber which houses a substrate, a heater part for heating the processing liquid in the processing chamber, and a substrate support part which is provided in the processing chamber and supports the substrate.

14 Claims, 9 Drawing Sheets

FIG. 9

|  | QUARTZ | SILICON CARBIDE | ALUMINUM OXIDE |
|---|---|---|---|
| THERMAL CONDUCTIVITY (W/m·K) | 1.47(100℃) | 170 | 7.7 |
| SPECIFIC HEAT (J/(Kg·K)) | 772 | 690 | 780 |
| COEFFICIENT OF THERMAL EXPANSION (J/Kg·K) | 0.51 | 4.1 | 7.47 |

US 9,190,299 B2

APPARATUS FOR MANUFACTURING SEMICONDUCTOR DEVICE, METHOD OF MANUFACTURING SEMICONDUCTOR DEVICE, AND RECORDING MEDIUM

CROSS REFERENCE TO RELATED APPLICATIONS

This application is a continuation of International Application No. PCT/JP2012/080072, filed on Nov. 20, 2012, entitled "Apparatus for Manufacturing Semiconductor Device, Method of Manufacturing Semiconductor Device, and Recording Medium," which claims priority under 35 U.S.C. §119 to Application No. JP 2011-254184 filed on Nov. 21, 2011, entitled "Apparatus for Manufacturing Semiconductor Device, Method of Manufacturing Semiconductor Device, and Recording Medium," the entire contents of which are hereby incorporated by reference.

FIELD OF THE INVENTION

The present invention relates to an apparatus of manufacturing a semiconductor device, a method of manufacturing a semiconductor device, and a recording medium.

BACKGROUND

With miniaturization of semiconductor devices such as a large-scale integrated circuit (hereinafter referred to as an LSI), the technical difficulty of a processing technique of controlling leakage current interference between transistor elements has been increasing. In general, separation between elements of an LSI is performed using a method of forming a void, such as a groove or a hole, between elements to be separated in a substrate, such as a silicon substrate formed of, for example, silicon (Si), and depositing an insulating material in the void. In many cases, an oxide film is used as the insulating material. For example, a silicon oxide ($SiO_2$) film may be used as the oxide film. The silicon oxide film is formed by native oxidation of a silicon substrate itself or chemical vapor deposition (hereinafter also referred to as CVD). As an example, Patent document 1 discloses an example of a method of forming an insulating film using CVD.

Due to recent miniaturization of semiconductor devices, a void is formed on a substrate to have a deep structure in a longitudinal direction or to have a narrow, fine structure in a transverse direction. The void having the fine structure is filled using CVD to form an oxide film on the substrate. However, formation of a film in the void having the fine structure using CVD is reaching its technical limit.

Thus, a filling method using an oxide having fluidity, that is, a method of coating a dielectric material (spin on dielectric, hereinafter, also referred to as an SOD technique), has attracted attention. In the SOD technique, a coating dielectric material containing an inorganic or organic element called spin on glass (SOG) is used. A filling method using the coating dielectric material was adopted for a process of fabricating an LSI before the advent of the above-described technique of forming an oxide film on a substrate using CVD.

In the above-described SOD technique, a processing dimension ranges from about 0.35 μm to about 1.0 μm. In comparison, recent semiconductor devices represented as an LSI, a dynamic random access memory (DRAM), and a flash memory have the minimum processing dimension of less than 50 nm. For this reason, there may be some cases in which it is difficult to form an oxide film on a substrate having a fine structure using an SOD technique while maintaining the quality of an insulating film.

SUMMARY

The present invention is directed to providing an apparatus for manufacturing a semiconductor device, a method of manufacturing a semiconductor device, and a recording medium, in which a high-quality dense film is formed on a substrate having a fine structure.

According to one aspect of the present invention, there is provided an apparatus for manufacturing a semiconductor device, including: a process chamber configured to accommodate a substrate; a process liquid supply unit configured to supply a process liquid into the process chamber; a heating unit configured to heat the process liquid in the process chamber; and a substrate support disposed in the process chamber and supporting the substrate.

According to another aspect of the present invention, there is provided a method of manufacturing a semiconductor device, including: a process liquid supplying step of supplying a process liquid from a process liquid supply unit into a process chamber accommodating a substrate; and a process liquid heating step of heating the process liquid in the process chamber by a heating unit.

According to another aspect of the present invention, there is provided a non-transitory computer-readable recording medium storing a program that causes a computer to perform: a process liquid supplying sequence of supplying a process liquid from a process liquid supply unit into a process chamber accommodating a substrate; and a process liquid heating sequence of heating the process liquid in the process chamber by a heating unit.

In an apparatus for manufacturing a semiconductor device, a method of manufacturing a semiconductor device, and a recording medium according to the present invention, a high-quality dense film can be formed on a substrate with a fine structure.

BRIEF DESCRIPTION OF THE DRAWINGS

FIG. 9 is a table showing values of physical properties of quartz, silicon carbide, and aluminum oxide.

DETAILED DESCRIPTION

One Embodiment of the Present Invention

One embodiment of the present invention will now be described with reference to the accompanying drawings below.

(1) Structure of Substrate Processing Apparatus

Figure 1:
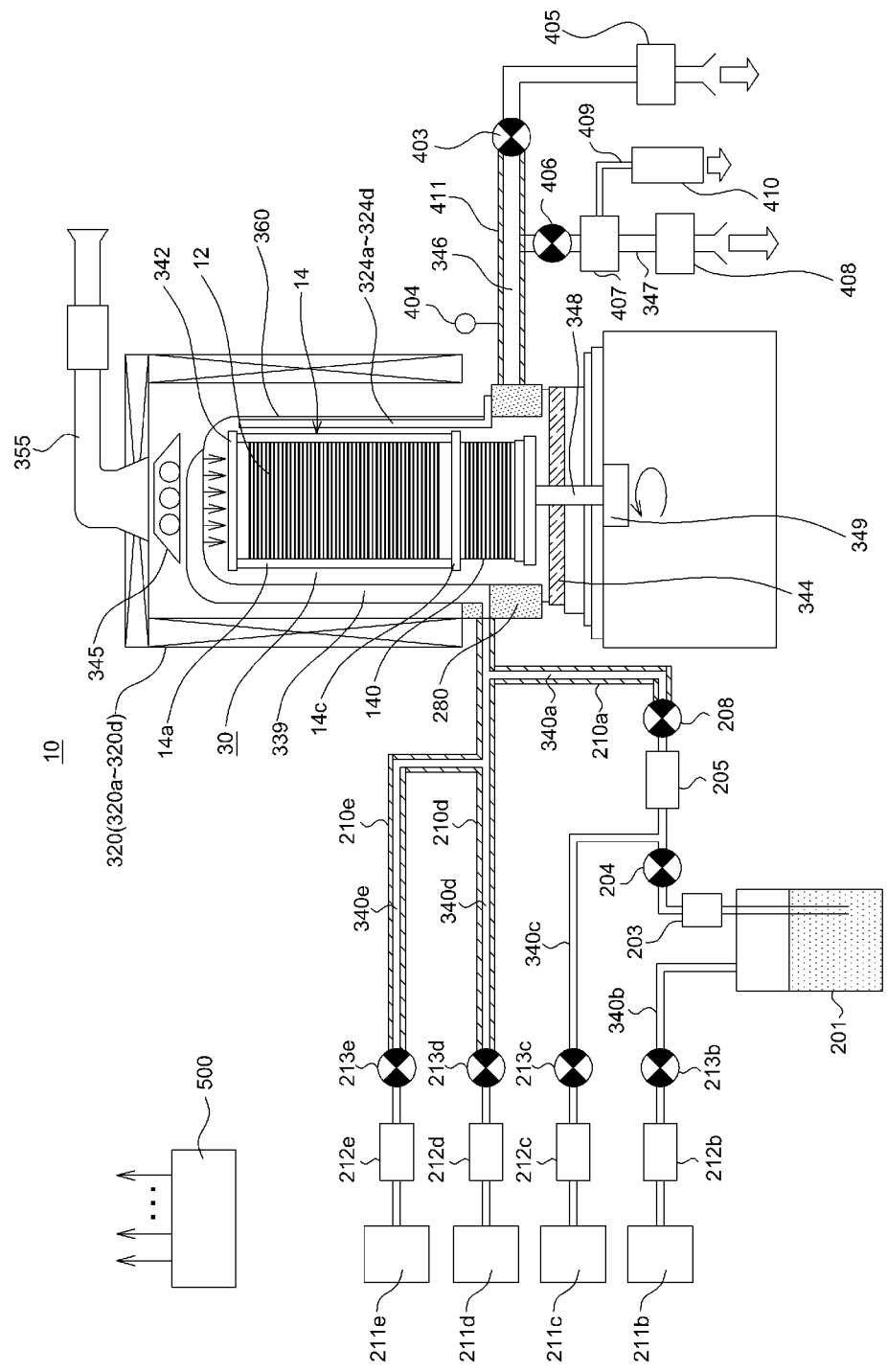
FIG. 1 is a schematic configuration diagram of a substrate processing apparatus according to an embodiment of the present invention.
Figure 2:
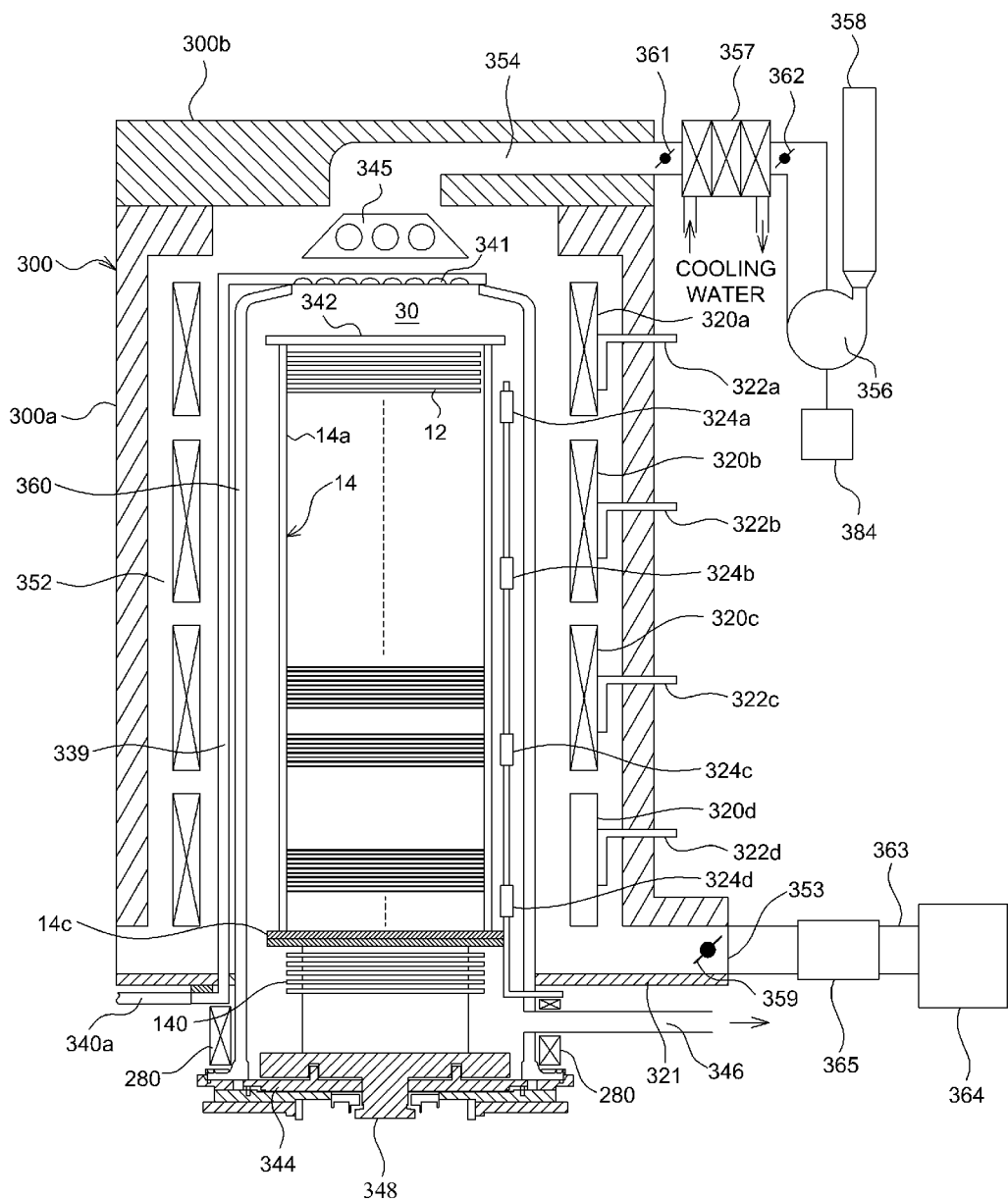
FIG. 2 is a schematic longitudinal sectional view of a process chamber included in a substrate processing apparatus according to an embodiment of the present invention.
Figure 3:
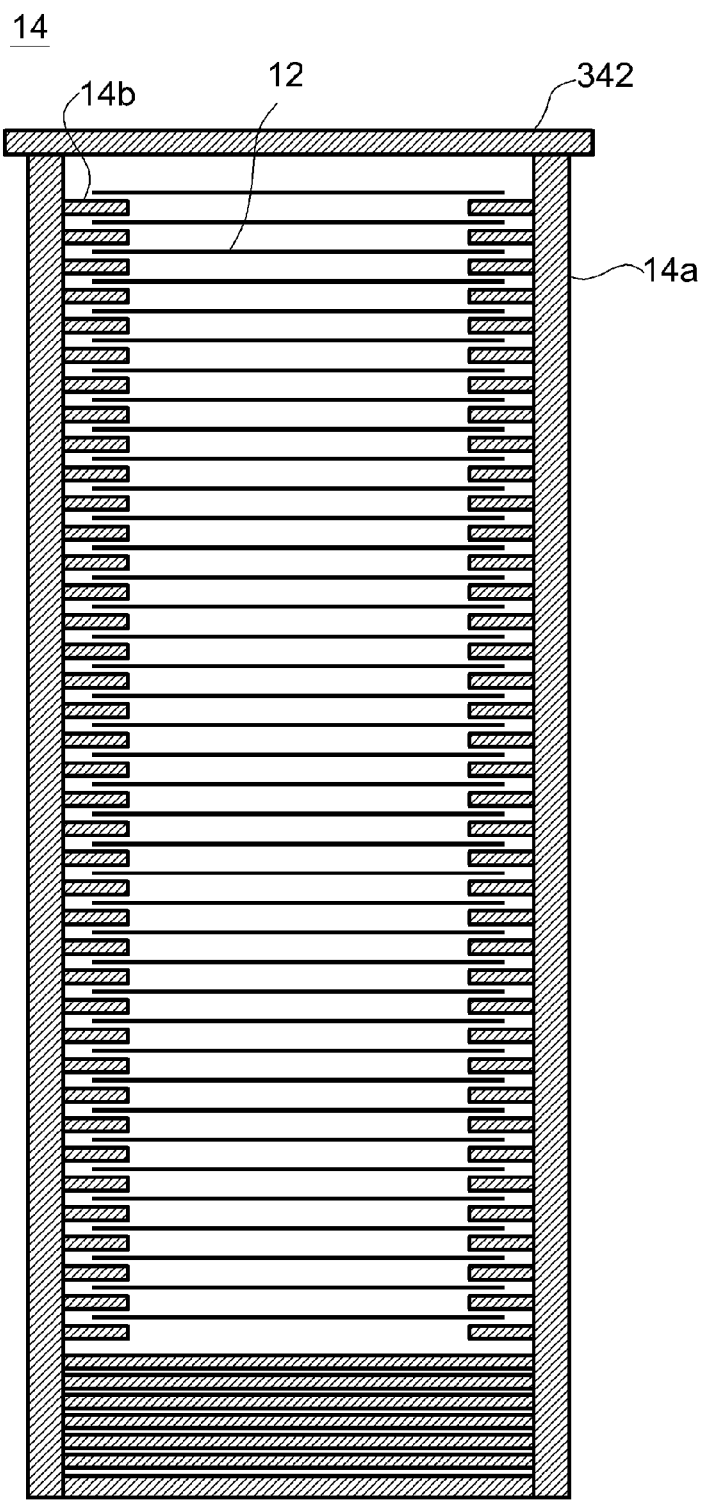
FIG. 3 is a partial exploded view of a longitudinal section of a substrate support included in a substrate processing apparatus according to an exemplary embodiment of the present invention.

To begin with, construction of a substrate processing apparatus according to the present embodiment will be mainly described with reference to FIGS. 1 through 3. FIG. 1 is a schematic configuration diagram of a substrate processing apparatus 10 according to the present embodiment, in which a longitudinal section of a portion of a process chamber 30 is illustrated. FIG. 2 is a schematic longitudinal sectional view of the process chamber 30 included in the substrate processing apparatus 10 according to the present embodiment. FIG. 3 is a partial exploded view of a longitudinal section of a substrate support included in the substrate processing apparatus 10 according to the present embodiment.

As illustrated in FIGS. 1 and 2, the process chamber 30 includes a process tube 360 (process container). The process tube 360 is formed of, for example, a heat-resistant material capable of transmitting light, such as quartz ($SiO_2$) or silicon carbide (SiC), or a heat-resistant material obtaining by combining $SiO_2$ and SiC, and has a cylindrical shape, a lower end of which is open. The process chamber 30 is formed in a hollow tubular portion of the process tube 360, and configured to accommodate wafers 12 serving as substrates such that the wafers 200 are vertically arranged in a horizontal posture in multiple stages using a boat 14 which will be described below. Also, a substrate having a rough structure (voids) which is a fine structure may be used as the wafer 12. The substrate having the fine structure refers to a substrate having a structure with a high aspect ratio, for example, a deep groove [concave portion] formed in a vertical direction to a silicon substrate or a narrow groove (concave portion) formed to a width of, for example, 10 nm to 50 nm in a transverse direction.

Below the process tube 360, a seal cap 344 serving as a furnace port lid that may air-tightly seal (close) a lower end aperture [furnace port] of the process tube 360 is installed via an O-ring. The seal cap 344 is configured to come in contact with a lower end of the process tube 360 from a lower portion thereof in a vertical direction. The seal cap 344 has a disk shape. The process chamber 30 which is a process space of the wafer 12 is configured by the process tube 360 and the seal cap 344.

First Heating Unit

A first heating unit 320 configured to heat the wafers 12 in the process tube 360 is installed outside the process tube 360 and has a hollow concentric circular shape surrounding a sidewall surface of the process tube 360. The first heating unit 320 is installed to be supported by a heater base. As illustrated in FIG. 2, the first heating unit 320 includes first through fourth heater units 320a to 320d. Each of the first through fourth heater units 320a to 320d is installed in the process tube 360 in a direction in which the wafers 12 are stacked. Each of the first through fourth heater units 320a to 320d radiates light, for example, from the vicinity of the process tube 360 and is configured such that light transmitted through the process tube 360 is absorbed by the wafer 12 to increase (heat) the temperature of the wafer 12.

Outside the process tube 360, first through fourth external temperature sensors 322a to 322d (e.g., thermocouples) are respectively installed at the first through fourth heater units 320a to 320d as temperature detectors configured to detect temperatures of the first through fourth heater units 320a to 320d.

Inside the process tube 360, first through fourth internal temperature sensors 324a to 324d (e.g., thermocouples) are respectively installed at the first through fourth heater units 320a to 320d as temperature detectors configured to detect the temperature of the wafer 12 or an ambient temperature. Each of the first through fourth internal temperature sensors 324a to 324d is installed between the process tube 360 and the boat 14. Also, each of the first through fourth internal temperature sensors 324a to 324d may be installed to detect a temperature of a wafer 12 disposed in the center, among a plurality of wafers 12 which are heated by each of the first through fourth heater units 320a to 320d.

A controller 500 which will be described below is electrically connected to each of the first heating unit 320 [the first through fourth heater units 320a to 320d], the first through fourth external temperature sensors 322a to 322d, and the first through fourth internal temperature sensors 324a to 324d. The controller 500 controls power supplied into each of the first through fourth heater units 320a to 320d at a predetermined time point based on temperature information detected by each of the first through fourth internal temperature sensors 324a to 324d so that the wafer 12 in the process tube 360 can have a predetermined temperature, and the first through fourth heater units 320a to 320d are configured to discretely set or control temperatures. Also, the controller 500 confirms whether or not each of the first through fourth heater units 320a to 320d is heated to a predetermined temperature based on temperature information detected by each of the first through fourth external temperature sensors 322a to 322d.

Substrate Support

The boat 14 which is a substrate support is configured to support a plurality of wafers 12 in multiple stages. As illustrated in FIG. 3, the boat 14 includes a plurality of props 14a (e.g., three props) configured to support a plurality of wafers 12. A plurality of substrate supporting units 14b are installed at the props 14a so that a plurality of wafers 12 may be placed. The plurality of substrate supporting units 14b are installed in a gravity direction of the boat 14. The substrate supporting units 14b are configured to support each of the wafers 12. Also, the substrate supporting units 14b are installed at right angles to the props 14a to horizontally support the wafers 12.

Each of the plurality of props 14a is erected between a lower plate 14c and an evaporator 342 which will be described below. A plurality of wafers 12 are held in multiple stages in a tubular axial direction in a state in which the props 14a are arranged in a horizontal posture or concentrically.

A material having low reactivity to a process liquid which will be described below may be used as a material forming the props 14a, the substrate supporting unit 14b, and the lower plate 14c. For example, the props 14a, the substrate supporting unit 14b, and the lower plate 14c may be formed of, for example, a material containing at least one of Teflon (a registered trademark), quartz, and ceramics, such as aluminum oxide ($Al_2O_3$), aluminum nitride (AlN), and silicon carbide (SiC). Thus, corrosion of the props 14a, the substrate supporting unit 14b, and the lower plate 14c due to the process liquid which will be described below may be inhibited. Also, a material forming the props 14a, the substrate supporting unit 14b, and the lower plate 14c may contain silicon nitride (SiN), zirconium oxide (ZrO), etc.

A nonmetal material having a good thermal conductivity (a high thermal conductivity), for example, silicon carbide (SiC), may be used more preferably as a material forming the props 14a, the substrate supporting unit 14b, and the lower plate 14c. In particular, a nonmetal material having a thermal conductivity of 10 W/mK or more may be used. Thus, the props 14a, the substrate supporting unit 14b, and the lower plate 14c may be inhibited from being cooled off by latent heat of evaporation of the process liquid which will be described below. That is, when a gas is generated by evaporating and evaporating the process liquid in the process tube 360 as described below, there have been cases in which the props 14a, the substrate supporting unit 14b, and the lower plate 14c are cooled off due to latent heat of evaporation of the process liquid. Thus, there have been cases in which the gas of the process liquid is cooled off in the process tube 360 to a temperature lower than Rthe evaporation point of the process liquid, and re-liquefied. In many cases, the re-liquefaction of the process liquid occurs at a point of the process tube 360 to which it is difficult to transmit heat generated by the first heating unit 320. Specifically, there have been many cases in which the re-liquefaction of the gas of the process liquid occurs, for example, at a point of contact of the substrate supporting unit 14b with the wafer 12 or under the boat 14. When the gas of the process liquid is re-liquefied, the process liquid may remain, for example, on the substrate supporting unit 14b. As a result, a so-called watermark may be formed at the point of contact of the substrate supporting unit 14b with the wafer 12, that is, an end portion of a rear surface of the wafer 12. Since the wafer 12 at which the watermark is formed is likely to reduce the yield of LSIs, the wafer 12 may be a defective processed product.

Also, when thermal conductivity does not matter, the props 14a, the substrate supporting unit 14b, and the lower plate 14c may be formed of quartz (Si) or the like. Also, when contamination of the water 12 with a metal does not matter, the props 14a or the like may be formed of a metal material, such as steel use stainless (SUS). When a metal is used as a material forming the props 14a, a coating film, such as ceramic or Teflon (a registered trademark), may be formed on the metal.

As illustrated in FIGS. 1 and 2, a heat insulating material 140 formed of a heat-resistant material, for example, quartz or silicon carbide, is installed below the boat 14, and configured to prevent heat generated from the first heating unit 320, which will be described below, from being transmitted to a side of the seal cap 344. The heat insulating material 140 functions not only as a heat insulating member but also as a retainer configured to retain the boat 14. Also, the heat insulating material 140 is not limited to installation of a plurality of insulating disk-type plates in a horizontal posture in multiple stages as shown. For example, the heat insulating material 140 may be a quartz cap formed in a cylindrical shape. Also, the heat insulating material 140 may be regarded as one of constitutional members of the boat 14.

A boat elevator serving as a lifting unit configured to move the boat 14 upward/downward and load the boat 14 into or unload the boat 14 from the process tube 360 is installed below the process tube 360. A seal cap 344 is installed at the boat elevator to encapsulate a furnace port when the boat 14 is moved upward by the boat elevator.

Boat rotating mechanisms (two boat rotating mechanisms having different boiling points) are installed at a side of the seal cap 344 opposite to the process chamber 30 to rotate the boat 14. Rotation axes 348 of the boat rotating mechanisms 349 are connected to the boat 14 via the seal cap 344, and configured to rotate the wafer 12 by rotating the boat 14.

Supply Unit
Process Liquid Supply Unit

A process liquid supply nozzle 339 through which a process liquid passes is installed between the process tube 360 and the first heating unit 320. The process liquid supply nozzle 339 is formed of, for example, quartz having low thermal conductivity. The process liquid supply nozzle 339 may have a double tubular structure. The process liquid supply nozzle 339 is disposed and installed along a side portion of an outer wall of the process tube 360. An upper end (downstream end) of the process liquid supply nozzle 339 is airtightly installed at a top portion (top-end opening) of the process tube 360. A plurality of support holes 341 are installed in the process liquid supply nozzle 339 disposed at the top-end opening of the process tube 360 from an upstream side to a downstream side (refer to FIG. 2). The supply holes 341 are formed to spray a process liquid supplied into the process tube 360 toward an evaporator 342 that will be described below.

A downstream end of the process liquid supply pipe 340a configured to supply the process liquid is connected to an upstream end of the process liquid supply nozzle 339. A storage tank 201 which is a liquid source supply tank, a liquid mass flow controller (LMFC) 203 which is a liquid flow rate controller (liquid flow rate control unit), a valve 204 which is an opening/closing valve, a separator 205, and a valve 208 which is an opening/closing valve are sequentially installed at the process liquid supply pipe 340a. Also, a sub-heater 210a, for example, an inlet tube heater, may be installed at the process liquid supply pipe 340a at least at a downstream side of the valve 208. The sub-heater 210a is configured to heat the process liquid supply pipe 340a to a predetermined temperature (e.g., about 50° C. to 300° C.) so that a process liquid flowing in the process liquid supply pipe 340a can be preheated.

A point at which the process liquid supply pipe 340a is in contact with the process liquid, i.e., an inner surface of the process liquid supply pipe 340a, may be formed of a material having low reactivity to the process liquid. The inner surface of the process liquid supply pipe 340a may include a material containing at least one of, for example, Teflon (a registered trademark), quartz, and ceramics, such as aluminum oxide ($Al_2O_3$), aluminum nitride (AlN), and silicon carbide (SiC). Also, a coating film, for example, Teflon (a registered trademark), may be formed on the inner surface of the process liquid supply pipe 340a. Thus, corrosion of the process liquid supply pipe 340a may be inhibited.

The process liquid is supplied from the process liquid supply pipe 340a into the process chamber 30 via the liquid mass flow controller 203, the valve 204, the separator 205, the valve 208, and the process liquid supply nozzle 339. An evaporation source having a boiling point of 50° C. to 200° C. may be used as the process liquid. That is, an oxidizer liquid, for example, oxygenated water or water ($H_2O$), may be used as the process liquid.

The oxygenated water, for example, uses hydrogen peroxide ($H_2O_2$), which is a solid or a liquid at room temperature, and uses water ($H_2O$) as a solvent, and is generated by dissolving the hydrogen peroxide in the water. Hydrogen peroxide is preferably contained in the oxygenated water at a content of 1% to 40%. In the present embodiment, for example, oxygenated water containing hydrogen peroxide at a content of 15% to 30% is preferably used. Also, a solvent for dissolving hydrogen peroxide is not limited to water.

Since oxygenated water ($H_2O_2$) has a simple structure in which oxygen molecules bond to hydrogen, the oxygenated water is liable to permeate a low-density medium. Also, oxygenated water decomposes to generate hydroxy radicals (OH*). The hydroxy radicals are a kind of active oxygen and are neutral radicals in which oxygen bonds to hydrogen. Accordingly, in the present embodiment, oxidation processing is performed on the wafer 12 due to the hydroxy radicals generated by decomposing the oxygenated water supplied into the process chamber 30.

The inventors confirmed through research that when a wafer 12 in which a rough portion (groove) which was a fine structure had been formed was used and a film formed in the groove was oxidized, and then oxygenated water was used as a process liquid, a film formed in a deeper spot (a bottom portion of a groove) of the groove could be oxidized than when water was used as the process liquid. That is, it was confirmed that oxygenated water in a gas state had a higher oxidizing power than water in a gas state. This may be because oxygenated water in a gas state has higher energy than water in a gas state, and hydrogen peroxide contains a larger amount of oxygen than water. Accordingly, when oxygenated water is used as a process liquid, the film formed in the bottom portion of the groove of the wafer 12 may be further oxidized to form an oxidized film. Also, the oxidized film formed in the groove of the wafer 12 may uniformize the amount of oxygen between the surface and the inside (bottom portion), and thus a dielectric constant may be uniformized.

Also, oxygenated water acts more actively in usage environments maintained at a low temperature of, for example, 40° C. to 100° C., which is higher than a normal temperature. Thus, a larger amount of oxygenated water may be supplied into the silicon-containing film formed in the deep spot of the groove of the wafer 12. Also, the oxidizing power of hydrogen peroxide may be sufficiently exhibited in the above-described temperature range. Accordingly, oxidation processing may be performed at a low temperature or in a short period of time.

A downstream end of a carrier gas supply pipe 340b configured to supply a carrier gas is connected to an upper portion of the storage tank 201. A carrier gas supply source 211b, a mass flow controller 212b which is a flow rate controller (flow rate control unit), and a valve 213b which is an opening/closing valve are sequentially installed at the carrier gas supply pipe 340b from an upstream end.

The carrier gas is supplied from the carrier gas supply pipe 340b via the mass flow controller 212b and the valve 213b into the storage tank 201. As the carrier gas, for example, nitrogen ($N_2$) gas or a rare gas, such as He gas, Ne gas, or Ar gas, may be used.

A process liquid supply unit is mainly configured by the process liquid supply pipe 340a, the liquid mass flow controller 203, the valve 204, the separator 205, the valve 208, and the process liquid supply nozzle 339. Also, the process liquid supply unit may include the storage tank 201, the carrier gas supply pipe 340b, the carrier gas supply source 211b, the mass flow controller 212b, and the valve 213b.

Inert Gas Supply Unit

A downstream end of the inert gas supply pipe 340c is connected between the valve 204 of the process liquid supply pipe 340a and the separator 205. An inert gas supply source 211c, a mass flow controller (MFC) 212c which is a flow rate controller, and a valve 213c which is an opening/closing valve are sequentially installed at the inert gas supply pipe 340c from an upstream end.

An inert gas is supplied from the inert gas supply pipe 340c via the mass flow controller 212c, the valve 213c, the separator 205, the valve 208, the process liquid supply pipe 340a, and the process liquid supply nozzle 339 into the process chamber 30. As the inert gas, for example, nitrogen ($N_2$) gas or a rare gas, such as He gas, Ne gas, or Ar gas, may be used.

An inert gas supply unit is mainly configured by the inert gas supply pipe 340c, the mass flow controller 212c, and the valve 213c. Also, the inert gas supply unit may include the inert gas supply source 211c or include the process liquid supply pipe 340a, the separator 205, the valve 208, and the process liquid supply nozzle 339.

Water Vapor Gas Supply Unit

A downstream end of the first gas supply pipe 340d is connected to the process liquid supply pipe 340a downstream from the valve 208. A source gas supply source 211d, a mass flow controller 212d which is a flow rate controller (a flow rate control unit), and a valve 213d, which is an opening/closing valve are sequentially installed at the first gas supply pipe 340d from an upstream end. A sub-heater 210d, for example, an inlet tube heater, may be installed at the first gas supply pipe 340d downstream from at least the valve 213d. The sub-heater 210d is configured to heat the first gas supply pipe 340d to a predetermined temperature of, for example, 50° C. to 300° C. so that a fluid flowing in the first gas supply pipe 340d can be preheated.

A first process gas is supplied from the first gas supply pipe 340d via the mass flow controller 212d or the valve 213d and the process liquid supply nozzle 339 into the process chamber 30. For example, hydrogen ($H_2$) gas may be used as the first process gas.

A downstream end of the second gas supply pipe 340e is connected to the first gas supply pipe 340d downstream from the valve 213d. A source gas supply source 211e, a mass flow controller 212e which is a flow rate controller (flow rate control unit, and a valve 213e which is an opening/closing valve are sequentially installed at the second gas supply pipe 340e from an upstream end. A sub-heater 210e, for example, an inlet tube heater, may be installed at the second gas supply pipe 340e downstream from at least the valve 213e. The sub-heater 210e is configured to heat the second gas supply pipe 340e to a predetermined temperature of, for example, 50° C. to 300° C. so that a fluid flowing in the second gas supply pipe 340e can be preheated.

A second process gas is supplied from the second gas supply pipe 340e via the mass flow controller 212a or the valve 213e and the process liquid supply nozzle 339 into the process chamber 30. For example, oxygen ($O_2$) gas may be used as the second process gas.

A first process gas supply unit is mainly configured by the first gas supply pipe 340d, the mass flow controller 212d, and the valve 213d. Also, the first process gas supply unit may further include the source gas supply source 211d or include the process liquid supply pipe 340a and the process liquid supply nozzle 339. Also, a second process gas supply unit is mainly configured by the second gas supply pipe 340e, the mass flow controller 212e, and the valve 213e. Also, the second process gas supply unit may further include the source gas supply source 211e or include the process liquid supply pipe 340a, the first gas supply pipe 340d, and the process liquid supply nozzle 339. A water vapor gas supply unit is configured by the first process gas supply unit and the second process gas supply unit.

A supply unit is configured by the process liquid supply unit, the inert gas supply unit, and the water vapor gas supply unit.

Evaporator

An evaporator 342 configured to evaporate the process liquid supplied from the process liquid supply unit into the process tube 360 is installed in the process tube 360. That is, the evaporator 342 is heated by a second heating unit 345 which will be described below, and configured to heat, evaporate, and vaporize the process liquid, for example, oxygenated water, which is supplied from the supply holes 341, and generate the gas of the process liquid. The evaporator 342 is installed to be supported by the props 14a. A diameter of the evaporator 342 is set to be greater than the maximum outer diameter of the wafer 12 supported by the boat 14. That is, the evaporator 342 is configured such that the wafer 12 is covered by the evaporator 342 when the evaporator 342 is seen from sides of the supply holes 341. Also, the evaporator 342 also functions as a ceiling plate of the boat 14.

The evaporator 342 may be formed of a material having low reactivity to the process liquid. The evaporator 342 may be formed of, for example, a material containing at least one of Teflon (a registered trademark), quartz, and ceramics, such as aluminum oxide ($Al_2O_3$), aluminum nitride (AlN), and silicon carbide (SiC). Thus, corrosion of the evaporator 342 due to the process liquid may be inhibited. Also, silicon nitride (SiN) or zirconium oxide (ZrO) may be contained as a material forming the evaporator 342. Also, as a material forming the evaporator 342, a nonmetal material having a good thermal conductivity (a high thermal conductivity), for example, silicon carbide (SiC), is particularly preferably used.

Second Heating Unit

A second heating unit 345 is installed on an outer side of the process tube 360. That is, the second heating unit 345 is installed over the evaporator 342 via the supply holes 341. The second heating unit 345 is configured to heat the evaporator 342 installed to be supported by the props 14a of the boat 14. The second heating unit 345 is configured to heat the evaporator 342 to a temperature of, for example, about 200° C. Also, the second heating unit 345 is configured to heat the supply holes 341 and the vicinity thereof. Thus, adhesion of a process liquid, such as oxygenated water, to the supply holes 341 may be prevented. For example, a lamp heater unit (e.g., a carbon lamp) or a resistive heater may be used as the second heating unit 345. In this case, light having such a wavelength as to easily heat the process liquid supply nozzle 339 is preferably radiated from the second heating unit 345. For example, when the evaporator 342 is formed of silicon carbide, the emissivity of the evaporator 342 approximates 1. Accordingly, the evaporator 342 not only efficiently absorbs far infrared light but also has high luminance in absorption wavelength ranges of the supply holes 341 formed of, for example, quartz, or constitutional members disposed in the vicinity thereof. Thus, the supply holes 341 formed of quartz and the constitutional members disposed in the vicinity thereof can be heated efficiently.

Controller 500

A controller 500 which will be described below is electrically connected to the second heating unit 345. The controller 500 is configured to control power supplied into the second heating unit 345 at a predetermined time point so that the evaporator 342 can be set to a predetermined temperature.

Here, an operation of evaporating a process liquid in the process chamber 30 [process tube 360] and generating a gas (process gas) will be described. To begin with, a carrier gas is supplied from the carrier gas supply pipe 340b via the mass flow controller 212b and the valve 213b into the storage tank 201. Thus, the process liquid stored in the storage tank 201 is sent to the process liquid supply pipe 340a. The process liquid supplied from the storage tank 201 into the process liquid supply pipe 340a is supplied via the liquid mass flow controller 203, the valve 204, the separator 205, the valve 208, and the process liquid supply nozzle 339 into the process tube 360. Also, the process liquid supplied into the process tube 360 is brought into contact with the evaporator 342 heated by the second heating unit 345, and evaporates to become a gas (process gas) of the process liquid. The process gas is supplied onto the wafer 12 in the process tube 360 so that a predetermined substrate processing process can be performed on the wafer 12.

Also, to accelerate the evaporation of the process liquid, the process liquid flowing in the process liquid supply pipe 340a may be preheated by the sub-heater 210a. Thus, the process liquid may be supplied into the process tube 360 in a state in which the process liquid is vaporized more easily. Also, the process liquid flowing in the process liquid supply nozzle 339 may be preheated by the first heating unit 320 [first through fourth heater units 320a to 320d].

Third Heating Unit

A liquefaction prevention heater 280 which is a third heater is installed below the process tube 360 and above the seal cap 344 to surround a sidewall surface of the process tube 360. The liquefaction prevention heater 280 includes, for example, a resistive heater or a lamp heater. Thus, the gas of the process liquid may be prevented from being re-liquefied in a lower region [i.e., a region configured to accommodate the heat insulating material 140 in the process tube 360] in the process tube 360.

By preventing the gas of the process liquid from being re-liquefied in the process tube 360, damage to constitutional members such as the seal cap 344 in the process chamber 30 may be inhibited. That is, by heating a lower portion of the process tube 360 using the liquefaction prevention heater 280, a liquid generated by re-liquefying the gas of the process liquid in the process tube 360 (hereinafter, also referred to simply as a "liquid") may be prevented from remaining in the lower portion in the process tube 360 [a top surface of the seal cap 344].

Also, when oxygenated water is used as the process liquid, a liquid generated by re-liquefying the gas of the process liquid in the process tube 360 may contain hydrogen peroxide at a higher concentration than oxygenated water supplied into the process tube 360. When the liquefaction and evaporation (vaporization) of the oxygenated water in the process tube 360 are repeated, it is inferred that oxygenated water containing hydrogen peroxide at a high concentration is generated in the process tube 360. The oxygenated water containing hydrogen peroxide at a high concentration has a high oxidative property. When the hydrogen peroxide having the high oxidative property is generated, a difference in the concentration of hydrogen peroxide occurs between an upper portion (upstream side) and a lower portion (downstream side) in the process tube 360 and the processing of the wafer 12 may become non-uniform in the process tube 360. Accordingly, uniform processing may be performed on the wafer 12 by inhibiting re-liquefaction of the gas of the process liquid in the process tube 360.

Exhaust Unit

An upstream end of the first exhaust pipe 346 configured to exhaust gases from the inside of the process chamber 30 is connected to a lower portion of the process tube 360. The first exhaust pipe 346 may be formed of a material which has low reactivity to the process liquid, for example, Teflon (a registered trademark). Also, when the first exhaust pipe 346 is formed of a metal, a coating film, such as Teflon (a registered trademark), may be formed on an inner surface of the first exhaust pipe 346. Thus, corrosion of the first exhaust pipe 346 due to the process liquid may be inhibited.

A pressure sensor 404 which is a pressure detector (pressure detection unit) configured to detect a pressure in the process tube 360, an auto pressure controller (APC) valve 403 which is a pressure regulator (pressure regulating unit), and a vacuum pump 405 which is a vacuum exhaust device are sequentially installed at the first exhaust pipe 346 in an upstream direction. The inside of the process chamber 30 is configured to be exhausted by a subatmospheric pressure generated by the vacuum pump 405. That is, the first exhaust pipe 346 is configured to vacuum-exhaust the inside of the process tube 360 such that a pressure in the process tube 360 is set to a predetermined pressure (degree of vacuum) by the vacuum pump 405. Also, the APC valve 403 is an opening/closing valve, which may be opened and closed to exhaust the inside of the process chamber 30 and stop exhausting the inside of the process chamber 30. Also, the APC valve 403 may be a pressure regulating valve, of which an opening rate may be controlled to regulate a pressure in the process chamber 30.

An exhaust tube heater 411, which is an exhaust heating unit configured to heat the first exhaust pipe 346, is installed at the first exhaust pipe 346 upstream from at least the APC valve 403. The exhaust tube heater 411 heats the first exhaust pipe 346 to prevent condensation in the first exhaust pipe 346.

A controller 500 which will be described below is electrically connected to the exhaust tube heater 411. The controller 500 is configured to control power supplied into the exhaust tube heater 411 such that the first exhaust pipe 346 is set to a predetermined temperature of, for example, 50° C. to 300° C.

An upstream end of the second exhaust pipe 347 is connected to the first exhaust pipe 346 upstream from the APC valve 403. A valve 406 which is an opening/closing valve, a separator 407 configured to separate an exhaust gas exhausted from the process tube 360 into a liquid and a gas, and a vacuum pump 408 which is a vacuum exhaust device are sequentially installed at the second exhaust pipe 347 from an upstream end. An upstream end of the third exhaust pipe 409 is connected to the separator 407, and a liquid collection tank 410 is installed at the third exhaust pipe 409. For example, a gas chromatograph may be used as the separator 407.

The second exhaust pipe 347 and the third exhaust pipe 409 may be formed of a material having low reactivity to the process liquid, for example, Teflon (a registered trademark). Also, when the second exhaust pipe 347 and the third exhaust pipe 409 are formed of a metal, a coating film, for example, Teflon (a registered trademark), may be formed at least on inner surfaces of the second exhaust pipe 347 and the third exhaust pipe 409. Thus, corrosion of the second exhaust pipe 347 and the third exhaust pipe 409 due to the process liquid may be inhibited.

A controller 500 which will be described below is electrically connected to the APC valve 403 and the pressure sensor 404. The controller 500 is configured to control an opening rate of the APC valve 403 based on pressure information detected by the pressure sensor 404 such that a pressure in the process chamber is set to be a predetermined pressure.

An exhaust unit is mainly configured by the first exhaust pipe 346. Also, the exhaust unit may include the second exhaust pipe 347, the APC valve 403, the pressure sensor 404, the valve 406, the separator 407, the liquid collection tank 410, the vacuum pump 406, and the vacuum pump 408.

Process Pipe Cooling Unit

As illustrated in FIG. 2, a heat insulating member 300 is installed at an outer circumference of the first heating unit 320 to coat the process tube 360 and the first heating unit 320. The heat insulating member 300 includes a side heat insulating member 300a installed to surround a sidewall of the process tube 360, and an upper heat insulating member 300b installed to coat an upper end of the process tube 360. The side heat insulating member 300a and the heat insulating member 300b are air-tightly connected to each other. Also, in the heat insulating member 300, the side heat insulating member 300a and the upper heat insulating member 300b may be unified. The heat insulating member 300 is formed of a heat-resistant material, for example, quartz or silicon carbide.

An intake port 353 is formed below the side heat insulating member 300a to supply a cooling gas into a space 352 between the process tube 360 and the heat insulating member 300. In the present embodiment, the intake port 353 is formed by a lower end portion of the side heat insulating member 300a and a heater base 321. However, the intake port 353 may be formed, for example, by installing an opening in the side heat insulating member 300a. A downstream end of the cooling gas supply pipe 363 is connected to the intake port 353. A cooling gas supply source 364, a mass flow controller 365 which is a flow rate controller (flow rate control unit), and a shutter 359 which is a cutoff valve, are sequentially installed at the cooling gas supply pipe 363 in an upstream direction. A cooling gas is supplied from the cooling gas supply pipe 363 into the space 352 via the mass flow controller 365 and the shutter 359. For example, nitrogen ($N_2$) gas or air may be used as the cooling gas.

A cooling gas supply unit is mainly configured by the cooling gas supply pipe 363 and the mass flow controller 365. Also, the cooling gas supply unit may further include the cooling gas supply source 364 or the shutter 359.

An exhaust path 354 is formed at the upper heat insulating member 300b to exhaust the atmosphere in the space 352 between the process tube 360 and the heat insulating member 300. An upstream end of the cooling gas exhaust pipe 355 is connected to a downstream end of the exhaust path 354. A shutter 361 which is a cutoff valve, a radiator 357 configured to circulate cooling water and cool off an exhaust gas flowing in the cooling gas exhaust pipe 355, a shutter 362 which is a cutoff valve, a cooling gas exhaust device 356 (e.g., a blower) configured to supply the exhaust gas from an upstream side of the cooling gas exhaust pipe 355 to a downstream side thereof, and an exhaust port 358 configured to discharge the exhaust gas out of the process chamber 30 are sequentially installed at the cooling gas exhaust pipe 355 in an upstream direction. For example, an inverter 384 is connected to the cooling gas exhaust device 356, and configured to operate the cooling gas exhaust device 356. For example, the inverter 384 is configured to control a rotation speed of a blower which is the cooling gas exhaust device 356.

A cooling gas exhaust unit configured to exhaust the atmosphere of the space 352 between the heat insulating member 300 and the process tube 360 is mainly configured by the exhaust path 354, the cooling gas exhaust pipe 355, the cooling gas exhaust device 356, the radiator 357, and the exhaust port 358. Also, the shutter 361 or the shutter 361 may be included in the cooling gas exhaust unit. Also, a process tube cooling unit is mainly configured by the cooling gas supply unit and the cooling gas exhaust unit which are described above.

Control Unit

Figure 4:
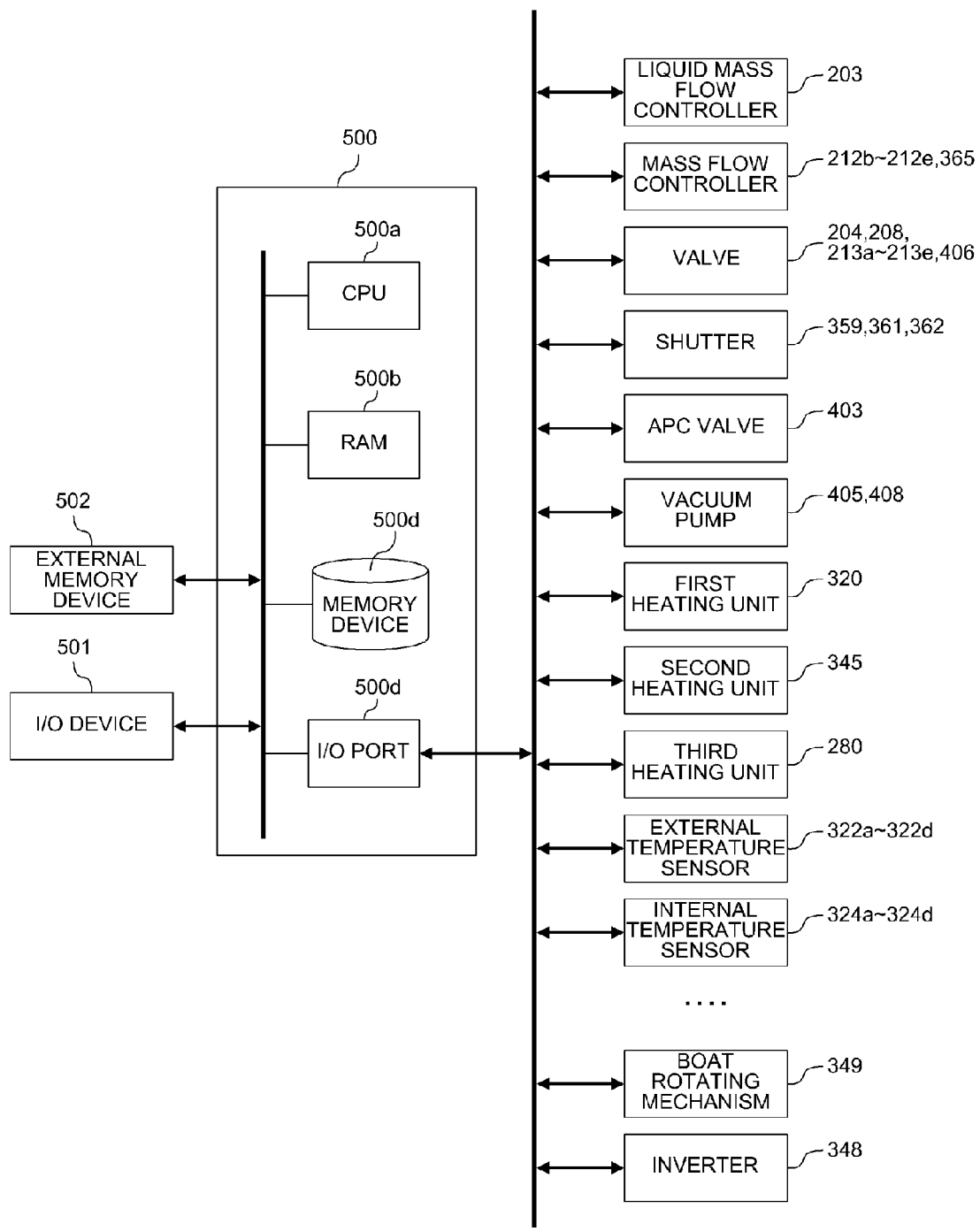
FIG. 4 is a schematic configuration diagram of a controller of a substrate processing apparatus preferably used in an exemplary embodiment of the present invention.

As illustrated in FIG. 4, a controller 500 which is a control unit (control means) is configured as a computer including a central processing unit (CPU) 500a, a random access memory (RAM) 500b, a memory device 500c, and an input/output (I/O) port 500d. The RAM 500b, the memory device 500c, and the I/O port 500d are configured to exchange data with the CPU 500a via an internal bus 500e. An I/O device 501 configured, for example, as a touch panel or the like is connected to the controller 500.

The memory device 500c is configured, for example, as a flash memory, a hard disk drive (HDD), or the like. In the memory device 500c, a control program for controlling an operation of a substrate processing apparatus 10 or a process recipe including an order or conditions of substrate processing which will be described below is stored to be readable. The process recipe is a combination of sequences of a substrate processing process which will be described below to obtain a desired result when the sequences are performed by the controller 500, and acts as a program. Hereinafter, the process recipe, the control program, etc. will also be referred to together simply as a "program." Also, when the term "program" is used in the present disclosure, it should be understood as including only a process recipe, only a control program, or both of the process recipe and the control program. The RAM 500b is configured as a work area in which a program or data read by the CPU 500a is temporarily stored.

The I/O port 500d is connected to the liquid mass flow controller 203, the mass flow controllers 212b, 212c, 212d, 212e, and 365, the valves 204, 208, 213b, 213c, 213d, 213e, and 406, the shutters 359, 361, and 362, the vacuum pumps 405 and 408, the APC valve 403, the first heating unit 320, the second heating unit 345, the third heating unit 280, the inverter 384, the first through fourth external temperature sensors 322a to 322d, the first through fourth internal temperature sensors 324a to 324d, the fourth temperature sensor 263d, and the boat rotating mechanism 349, which are described above.

The CPU 500a is configured to read and execute the control program from the memory device 500c and to read the process recipe from the memory device 500c according to a manipulation command received via the I/O device 501. Also, according to the read process recipe, the CPU 500a is configured to control a flow rate of a process liquid via the liquid mass flow controller 203; control flow rates of various gases via the mass flow controllers 212B, 212c, 212e, and 365; control opening/closing of the valves 204, 208, 213b, 213c, 213d, 213e, and 406; control cutoff operations of the shutters 359, 361, and 362; control an opening rate of the APC valve 403; control temperature using the first heating unit 320 based on the first through fourth external temperature sensors 322a to 322d and the first through fourth internal temperature sensors 324a to 324d; control temperatures of the second heating unit 345 and the third heating unit 280 based on the first through fourth external temperature sensors 322a to 322d and the first through fourth internal temperature sensors 324a to 324d; control driving/suspending of the vacuum pumps 405 and 408; control the rotation speed of the cooling gas exhaust device 356 using the inverter 384; and control the rotation speed of the boat rotating mechanism 349.

The controller 500 is not limited to a dedicated computer and may be configured as a general-purpose computer. For example, the controller 500 according to the present embodiment may be configured by preparing an external memory device 502 storing a program as described above, e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory, a memory card, etc.), and then installing the program in a general-purpose computer using the external memory device 502. Also, means for supplying a program to a computer are not limited to using the external memory device 502. For example, a program may be supplied to a computer using communication means, e.g., the Internet or an exclusive line, without using the external memory device 502. The memory device 500c or the external memory device 502 may be configured as a non-transitory computer-readable recording medium. Hereinafter, the memory device 121c and the external memory device 123 may also be referred to together simply as a 'recording medium.' Also, when the term 'recording medium' is used in the present disclosure, it may be understood as only the memory device 500c, only the external memory device 502, or both the memory device 500c and the external memory device 502.

(2) Substrate Processing Process

Figure 5:
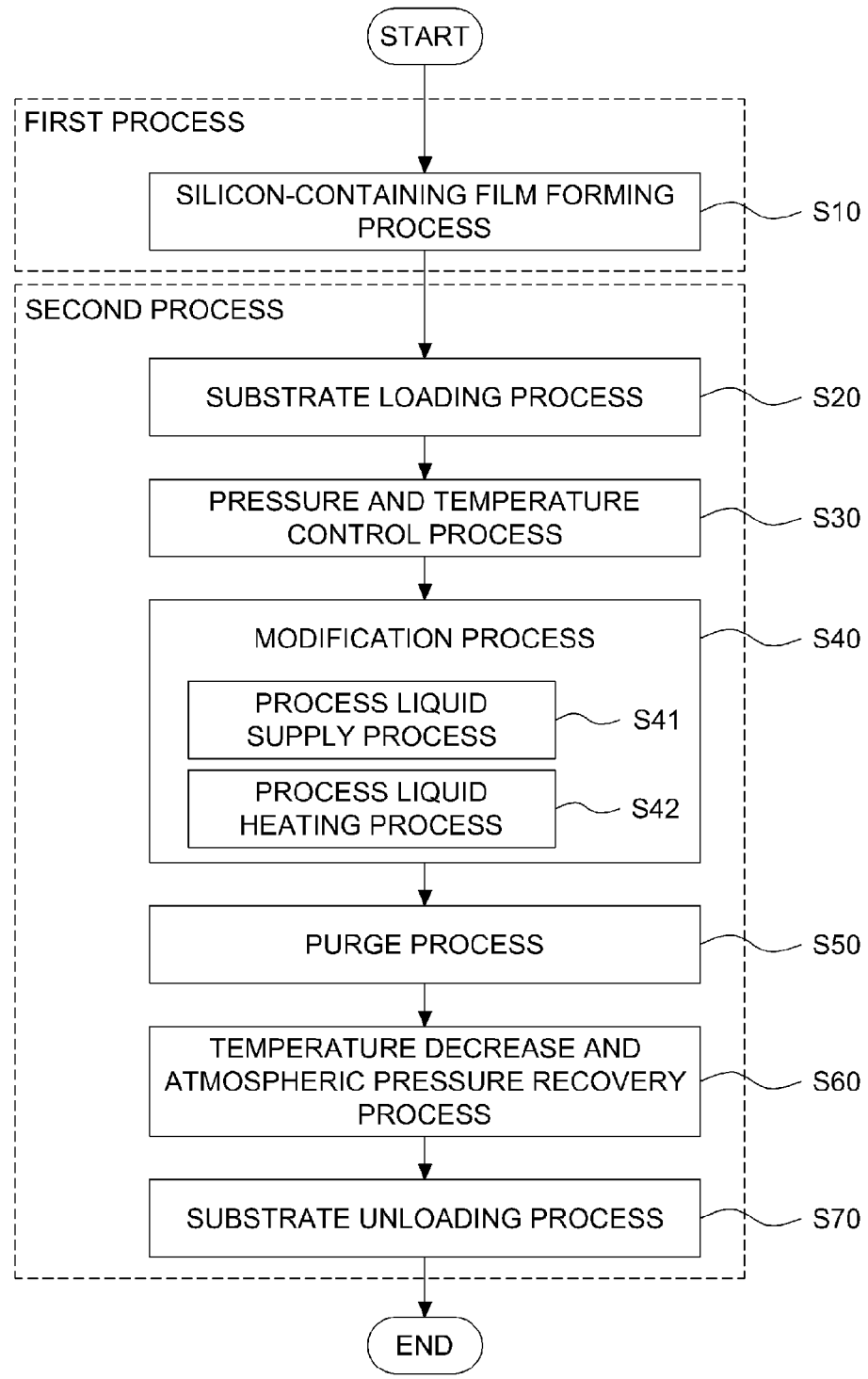
FIG. 5 is a flowchart illustrating a substrate processing process according to an exemplary embodiment of the present invention.

Next, a substrate processing process will be described as a process included in a process of manufacturing a semiconductor device according to the present embodiment mainly with reference to FIG. 5. FIG. 5 is a flowchart illustrating a substrate processing process according to the present embodiment. The substrate processing process is performed using the above-described substrate processing apparatus 10. In the following description, operations of constitutional elements of the substrate processing apparatus 10 are controlled by the controller 500 illustrated in FIG. 4.

In the present embodiment, a case in which a substrate having a rough structure which is a fine structure is used as the wafer 12 will be described. Also, the substrate having the fine structure refers to a substrate having a structure with a high aspect ratio, for example, a deep groove (concave portion) which is formed in a vertical direction to a silicon substrate, or a narrow groove (concave portion) which is formed to a small width of, for example, about 10 nm to about 50 nm in a transverse direction. Hereinafter, the concave portion formed in the wafer 12 is also referred to as a void.

Hereinafter, a case in which a first process of supplying polysilazane ($SiH_2NH$) to fill at least the concave portion (groove) formed in the wafer 12 and forming a silicon (Si)-containing film in the groove and a second process of modifying (oxidizing) the silicon-containing film formed on the wafer 12 into a silicon oxide film using oxygenated water as a process liquid are performed will be described. The silicon oxide film formed on the wafer 12 is used as an insulating film between electrodes.

First Process

A first process of forming a silicon-containing film on the wafer 12 will now be described.

Silicon-Containing Film Forming Process (S10)

To begin with, the wafer 12 having the fine structure is loaded into, for example, a spin coating apparatus. A liquid (silicon-containing material) obtained by dissolving, for example, a silicon material such as polysilazane ($SiH_2NH$) in a solvent such as xylene ($C_8H_{10}$) is supplied into the spin coating apparatus, and the wafer 12 is coated with a silicon-containing material. For example, at least one of xylene ($C_8H_{10}$), toluene ($C_6H_5CH_3$), and dibutyl ether ($C_8H_{18}O$) is used as the solvent. The coated film has a thickness of, for example, 100 nm to 700 nm. After the wafer 12 is coated with the silicon-containing material, a foaming gas (a gas obtained by diluting hydrogen with nitrogen) is supplied into the spin coating apparatus. Also, the wafer 12 is heated to a predetermined temperature of, for example, 150° C. in a foaming gas atmosphere to perform thermal treatment (prebake processing). By performing the prebake processing, the solvent is evaporated from the silicon-containing material. Thus, a polysilazane film which is the silicon-containing film is formed in the void contained in the wafer 12 (forming of a film). When the silicon-containing film is formed on the wafer 12, the wafer 12 is unloaded from the spin coating process.

Here, the silicon-containing film formed on the wafer 12 is mainly formed of a silicon material (polysilazane). However, elements of the solvent contained in the silicon-containing material may remain in the silicon-containing film. Also, in addition to silicon (Si), the silicon-containing film contains impurities, such as nitrogen (N) or hydrogen (H), which originate from a silicon material. That is, the silicon-containing film includes at least silazane bonds (Si—N bonds). Also, in some cases, there is a possibility that carbon (C) or other impurities may be mixed in the silicon-containing film. That is, there are many cases in which a liquid obtained by adding an organic solvent as a solvent to a silicon material, such as polysilazane, is used as a silicon-containing material in a spin coating process. Carbon (C) or other impurities (i.e., elements other than Si and O) which originate in the organic solvent may be mixed in the silicon-containing film.

Second Process

Next, a second process of modifying (oxidizing) the silicon-containing film formed on the wafer 12 into a silicon oxide film will be described.

Substrate Loading Process (S20)

To begin with, a plurality of wafers 12 on which the silicon-containing film is formed are charged in the boat 14 (wafer charging). The boat 14 retaining the plurality of wafers 12 is lifted by the boat elevator and loaded into the process tube 360 [process chamber 30] (boat loading). In this state, the furnace port which is the opening of the process tube 360 is air-tightly closed by the seal cap 344.

Pressure and Temperature Control Process (S30)

The inside of the process chamber 30 [process tube 360] is vacuum-exhausted by at least one of the vacuum pump 405 or the vacuum pump 408 to have a predetermined pressure. In this case, a pressure in the process chamber 30 may be measured by the pressure sensor 404, and an opening rate of the APC valve 403 is feedback-controlled based on measured pressure information (pressure control).

The wafers 12 contained in the process chamber 30 [process tube 360] are heated by the first heating unit 320 to a predetermined temperature of, for example, about 40° C. to about 300° C., preferably about 50° C. to about 150° C. In this case, power supplied into the first through fourth heater units 320a to 320d included in the first heating unit 320 is feedback-controlled based on temperature information detected by the first through fourth internal temperature sensors 324a to 324d, so that the wafers 12 in the process chamber 30 may have a predetermined temperature distribution (temperature control). In this case, all of the first through fourth heater units 320a to 320d are set to have the same temperature.

Also, while heating the wafers 12, the rotation of the boat 14 begins by operating the boat rotating mechanism 349. In this case, a rotation speed of the boat 14 is controlled by the controller 500. Also, the rotation of the boat 14 is always continuously performed at least until a modification process S40 which will be described below is completed.

Also, the heating of the evaporator 342 begins by supplying power to the second heating unit 345 such that the evaporator 342 is set to such a temperature as to vaporize oxygenated water which is a process liquid, for example, 150° C. to 170° C. or higher. Also, the second heating unit 345 is controlled to maintain a temperature of the evaporator 342 at a temperature of, for example, about 150° C. until the modification process S40 which will be described below is completed.

Also, power supplied into the sub-heaters 210a, 210d, and 210e, the liquefaction prevention heater 280, and the exhaust tube heater 411 is controlled such that the sub-heaters 210a, 210d, and 210e, the liquefaction prevention heater 280, and the exhaust tube heater 411 are set to predetermined temperatures [for example, each of the sub-heaters is set to a temperature of 50° C. to 100° C., and each of the liquefaction prevention heater 280 and the exhaust tube heater is set to a temperature of 100° C. to 300° C., preferably about 200° C.].

Also, the sub-heaters 210a, 210d, and 210e, the liquefaction prevention heater 280, and the exhaust tube heater 411 may be controlled to be the same temperature or each a different temperature.

Modification Process (S40)

Process Liquid Supply Process (S41)

When the wafer 12 is heated to a predetermined temperature and the boat 14 reaches a predetermined rotation speed, the supply of oxygenated wafer which is the process liquid from the process liquid supply pipe 340a into the process tube 360 begins. That is, to begin with, the valves 213c, 213d, and 213e are closed, the valve 213b is opened, and a carrier gas, the flow rate of which is controlled by the mass flow controller 212b, is supplied from the carrier gas supply source 211b into the storage tank 201. Also, the valve 204 and the valve 208 are opened, and oxygenated water, which is a process liquid stored in the storage tank 201 and the flow rate of which is controlled by the liquid mass flow controller 203, is supplied from the process liquid supply pipe 340a via the separator 205, the process liquid supply nozzle 339, and the supply holes 341 into the process tube 360 [process chamber 30]. As the carrier gas, for example, an inert gas such as nitrogen ($N_2$) gas or a rare gas such as He gas, Ne gas, or Ar gas, may be used. In this case, the valve 213c may be opened, and an inert gas may be supplied as a carrier gas from the inert gas supply pipe 340c.

Process Liquid Heating Process (S42)

The oxygenated water supplied into the process tube 360 is brought into contact with the evaporator 342 heated by the second heating unit 345, and evaporated and vaporized to generate vapor of the oxygenated water which is the process gas. Thus, the gas of the oxygenated water which is the process gas is generated in the process tube 360. That is, oxygenated water which is in a liquid state may be passed through the process liquid supply nozzle 339.

The gas of the oxygenated water is supplied onto the wafer 12, and the silicon-containing film formed on the wafer 12 is modified into a silicon oxide film (SiO film) due to an oxidation reaction of the gas of the oxygenated water with the surface of the wafer 12. That is, when the gas of the oxygenated water, which is supplied into the process tube 360 and vaporized by the evaporator 342, is supplied onto the wafer 12 and decomposes, hydroxy radicals (OH*) are generated. Silazane bonds (Si—N bonds) or Si—H bonds included in the silicon-containing film formed on the wafer 12 break due to oxidizing power of the hydroxy radicals. The broken nitrogen (N) or hydrogen (H) is substituted with oxygen (O) included in the hydroxyl radicals to form Si—O bonds in the silicon-containing film. As a result, the silicon-containing film is oxidized and modified into a silicon oxide film. Also, impurities, such as nitrogen (N) or hydrogen (H) broken due to the hydroxy radicals, are discharged to the outside of the process tube 360 from, for example, the exhaust unit.

Also, the gas of the oxygenated water supplied onto the wafer 12 may include a state of $H_2O_2$ molecules or a state of a cluster which is an aggregate of several molecules. Also, when oxygenated water ($H_2O_2$) is changed into a gas of oxygenated water, the oxygenated water may decompose into $H_2O_2$ molecules or a cluster which is an aggregate of several molecules. Also, the oxygenated water may change into a mist including several clusters.

The vacuum pump 408 and the liquid collection tank 410 are exhausted while supplying oxygenated water into the process tube 360. That is, the APC valve 403 is closed and the valve 406 is opened so that an exhaust gas exhausted from the inside of the process tube 360 can pass from the first exhaust pipe 346 via the second exhaust pipe 347 through the separator 407. Also, the exhaust gas is separated by the separator 407 into a liquid containing hydrogen peroxide and a gas which is free of hydrogen peroxide, the gas is exhausted from the vacuum pump 408, and the liquid is collected by the liquid collection tank 410.

Also, when the oxygenated water is supplied into the process tube 360, the valve 406 and the APC valve 403 may be closed, and pressure may be applied to the inside of the pressure tube 360. Thus, the atmosphere of the oxygenated water of the process tube 360 may be uniformized.

After a predetermined time has elapsed, the valves 204a, 213b, and 208 are closed, and the supply of the oxygenated water into the process tube 360 is stopped.

Purge Process (S50)

After the modification process S40 ends, the APC valve 403 is closed and the valve 406 is opened to vacuum-exhaust the inside of the process tube 360, and the gas of the oxygenated water remaining in the process tube 360 is exhausted. That is, the valve 406 is opened, and the valve 213c is opened while exhausting the process tube 360 [process chamber 30]. $N_2$ gas (an inert gas) which is a purge gas, the flow rate of which is controlled by the mass flow controller 212c, is supplied from the inert gas supply pipe 340c via the process liquid supply nozzle 339 into the process tube 360. As the purge gas, an inert gas, for example, nitrogen ($N_2$) gas or a rare gas such as helium (He) gas, neon (Ne) gas, or argon (Ar) gas, may be used. Thus, the discharge of the remaining gas from the process tube 360 may be accelerated. Also, by allowing the inert gas, such as $N_2$ gas, to pass through the process liquid supply nozzle 339, oxygenated water (hydrogen peroxide in a liquid state) remaining in the process liquid supply nozzle 339 may be extruded and removed. In this case, the oxygenated water may be exhausted from the vacuum pump 405 by adjusting an opening rate of the APC valve 403 and opening/closing of the valve 406.

Temperature Decrease and Atmospheric Pressure Recovery Process (S60)

After the purge process S50 ends, while the pressure in the process tube 360 is being recovered to atmospheric pressure by adjusting the valve 406 or the APC valve 403, the temperature of the wafer 12 is dropped to a predetermined temperature (e.g., a normal temperature). Specifically, while $N_2$ gas which is an inert gas is being supplied into the process tube 360 by opening the valve 213c, the pressure in the process tube 360 is increased to atmospheric pressure. Also, power supplied into the first heating unit 320 and the second heating unit 345 may be controlled, and the temperature of the wafer 12 may be dropped.

While the cooling gas exhaust device 356 is operated by dropping the temperature of the wafer 12, the shutters 359, 361, and 362 are opened, and a cooling gas, the flow rate of which is controlled by the mass flow controller 365, may be supplied from the cooling gas supply pipe 363 into the space 352 between the process tube 360 and the heat insulating member 300 and exhausted from the cooling gas exhaust pipe 355. As the cooling gas, not only the $N_2$ gas but also, for example, one or a mixture of rare gases such as He gas, Ne gas, or Ar gas or air may be used. Thus, the inside of the space 352 may be rapidly cooled so that the process tube 360 and the first heating unit 320 installed in the space 352 can be cooled in a short period of time. Also, by cooling the process tube 360, the wafer 12 contained in the process tube 360 may be cooled in a circumferential direction (from an outer circumferential side). That is, the temperature of the wafer 12 contained in the process tube 360 may decrease in a shorter period of time.

$N_2$ gas is supplied from the cooling gas supply pipe 363 into the space 352 while closing the shutters 361 and 362. After the inside of the space 352 is filled with the cooling gas and cooled, the shutters 361 and 362 may be opened while operating the cooling gas exhaust device 356, and the cooling gas in the space 352 may be exhausted from the cooling gas exhaust pipe 355.

Substrate Unloading Process S70

Then, the seal cap 344 is moved downward by the boat elevator to open the lower end of the process tube 360. Simultaneously, the processed wafers 12 are unloaded to the outside of the process tube 360 [process chamber 30] from the lower end of the process tube 360 while being retained by the boat 14 (boat unloading). Thereafter, the processed wafers 12 are unloaded from the boat 14 (wafer discharging), thereby ending the substrate processing process according to the present embodiment.

(3) Effects of the Present Embodiment

According to the present embodiment, one or more effects which will be described below may be obtained.

(a) According to the present embodiment, the process chamber 30 [process tube 360] includes a process liquid supply unit configured to supply a process liquid and a heating unit (second heating unit 345) configured to heat the process liquid in the process chamber 30. That is, the process liquid, which is in a liquid state, is supplied into the process tube 360, the process liquid is evaporated and vaporized by heating in the process tube 360 to generate a gas of the process liquid, and the gas of the process liquid is supplied onto the wafer 12 in the process chamber 30. Thus, a concentration of the gas of the process liquid supplied onto the wafer 12 may be uniformized. Accordingly, uniform processing may be performed on the wafer 12, and a high-quality dense film may be formed.

In addition, for example, the gas of the process liquid may be supplied and permeate into a film formed on a bottom (a deep spot in the groove) of a groove of a fine structure included in the wafer 12. As a result, uniform processing may be performed in the groove of the wafer 12, and a high-quality dense film may be formed. Also, even in the wafer 12 having a surface area increased by forming a fine rough structure having a processing dimension of, for example, 50 nm or less, uniform processing may be performed in the groove. Also, substrate processing may be performed with good reproducibility.

Also, since the process liquid is evaporated and vaporized in the process tube 360, generation of condensation may be prevented in equipment of a supply unit, such as the process liquid supply nozzle 339. Thus, extraneous matters formed on the wafer 12 may be reduced.

Also, by supplying the process liquid to the heating unit and evaporating the process liquid in a moment, even if a process liquid obtained by mixing materials having different boiling points, for example, a process liquid obtained by mixing hydrogen peroxide and water, is used, a deviation in concentration of the gas of the process liquid may be prevented.

Before the process liquid is supplied into the process tube 360, when the process liquid is vaporized and the gas of the process liquid is supplied into the process chamber 30 via the process liquid supply nozzle 339, a deviation in concentration may occur in the gas of the process liquid due to thermal conditions of the process liquid supply nozzle 339 while the gas of the process liquid is passing through the process liquid supply nozzle 339.

(b) According to the present invention, a process liquid contains hydrogen peroxide. That is, oxygenated water obtained by dissolving hydrogen peroxide in water which is a solvent is used as the process liquid. Thus, a silicon-containing film formed on the wafer 12 may be oxidized in a short period of time at a low temperature and modified into a silicon oxide film. By performing oxidation at a low temperature, only a surface portion (a top end of a groove) of the silicon-containing film may be prevented from being preferentially oxidized. Accordingly, uniform oxidation may be performed by the wafer 12 so that a film quality of the silicon oxide film can be further improved. In contrast, when oxidation is performed at a high temperature, only the surface portion of the silicon-containing film may be preferentially oxidized.

Also, by performing oxidation at a low temperature, a thermal load on a silicon oxide film (semiconductor device) may be reduced. That is, the silicon-containing film may be modified into the silicon oxide film without changing characteristics of semiconductor devices, such as a gate oxide film or gate electrode formed on the wafer 12. For example, deterioration of performance of a circuit formed on the wafer 12 may be prevented. Specifically, excessive diffusion of impurities (e.g., boron, arsenic, and phosphorus), which are implanted to operate a transistor, may be prevented. Also, condensation of a metal silicide for an electrode, a change in performance of a work function for a gate, and deterioration of a lifespan of repetition of reading or writing of a memory device may be prevented.

(c) According to the present embodiment, a silicon-containing film contains polysilazane. Thus, the silicon-containing film formed on the wafer 12 having the fine rough structure may be easily oxidized and modified into a silicon oxide film. That is, silazane bonds (Si—N bonds) or Si—H bonds in polysilazane break due to the oxidizing power of hydroxy radicals (OH*) generated by decomposition of hydrogen peroxide. Also, the broken nitrogen (N) or hydrogen (H) is substituted with oxygen (O) included in the hydroxy radicals so that Si—O bonds can be formed in the silicon-containing film.

Also, the silicon-containing film may be modified into a silicon oxide film, which includes not a large amount of NH— but Si—O bonds as a main frame. The formed silicon oxide film has a high thermal resistance unlike a conventional silicon oxide film formed of organic SOG.

(d) According to the present embodiment, among constitutional members of the substrate processing apparatus 10, a constitutional member in contact with the process liquid is formed of a material having low reactivity to the process liquid. That is, for example, the props 14a, the substrate supporting unit 14b, and the lower plate 14c of the boat 14, the process liquid supply pipe 340a, the first exhaust pipe 346, the second exhaust pipe 347, and the third exhaust pipe 409 may be formed of, for example, a material containing at least one of Teflon (a registered trademark), quartz, and ceramics, such as aluminum oxide ($Al_2O_3$), aluminum nitride (AlN), and silicon carbide (SiC). Thus, corrosion of the constitutional member in contact with the process liquid due to the process liquid may be inhibited.

(e) According to the present embodiment, an exhaust tube heater 411 configured to heat the first exhaust pipe 346 is installed at the first exhaust pipe 346 at least at an upstream side of the APC valve 403. Thus, re-liquefaction of the process liquid in the exhaust unit may be inhibited. Accordingly, for example, after the process liquid is re-liquefied in the exhaust unit, a gas of the re-vaporized process liquid may be prevented from flowing backward into the process tube 360. As a result, extraneous matters formed on the wafer 12 may be reduced.

Other Embodiments of the Present Invention

Although the exemplary embodiment of the present invention has been described in detail, the present invention is not limited thereto and may be variously changed without departing from the scope and spirit of the present invention.

The previous embodiment has been described as a case in which oxygenated water is used as a process liquid, and after the oxygenated water is supplied into the process tube 360, the oxygenated water is evaporated and vaporized in the process tube 360 to generate a gas of the oxygenated water, and an oxidation process is performed on the wafer 12. However, the present invention is not limited thereto. In addition, an oxidation process may be performed on the wafer 12 using, for example, water ($H_2O$), as the process liquid.

Also, when water ($H_2O$) is used as the process liquid, water vapor supplied onto the wafer 12 may include a state of $H_2O$ molecules or a state of a cluster which is an aggregate of several molecules. Also, when water ($H_2O$) is changed from a liquid state to a gas state, the water may decompose into $H_2O$ molecules or a cluster which is an aggregate of several molecules. Also, the water may change into a mist including several clusters.

Also, a water-vaporized gas ($H_2O$) obtained by heating, for example, a gas containing hydrogen atoms (H) (hydrogen-containing gas) such as hydrogen ($H_2$) gas and, for example, a gas containing oxygen atoms (O) (oxygen-containing gas) such as oxygen ($O_2$) gas, may be used. That is, by closing the valves 204, 213b, and 208 and opening the valves 213d and 213e, $H_2$ gas and $O_2$ gas, the flow rates of which are respectively controlled by the mass flow controllers 212d and 212e, may be respectively supplied from the first gas supply pipe 340d and the second gas supply pipe 340e into the process tube 360. Also, the $H_2$ gas and the $O_2$ gas supplied into the process tube 360 are reacted and brought into contact with the evaporator 342 heated by the second heating unit 345 to generate water vapor, and the water vapor is supplied onto the wafer 12 so that, for example, a silicon-containing film formed on the wafer 12 may be modified into a silicon oxide film (SiO film). As the oxygen-containing gas, not only $O_2$ gas but also, for example ozone ($O_3$) gas or water vapor ($H_2O$) may be used. The ozone gas or water vapor is particularly effective when the wafer 12 to be processed may resist to high temperatures.

In the previous embodiment, a process liquid supplied into the process chamber 30 is brought into contact with the evaporator 342 and evaporated and vaporized to generate a gas of the process liquid in the process chamber 30, but the present invention is not limited thereto. That is, the process liquid supplied into the process chamber 30 may be heated in the process chamber 30 and evaporated and vaporized. For example, the process liquid may be heated and vaporized in the process chamber 30 by heating a joint portion between the process liquid supply nozzle 339 and the process chamber 30 [process tube 360].

In the previous embodiment, a process liquid supplied into the process chamber 30 is brought into contact with the evaporator 342 and evaporated and vaporized to generate a gas of the process liquid in the process chamber 30, but the present invention is not limited thereto. That is, the process liquid supplied into the process chamber 30 may be heated in the process chamber 30 and evaporated and vaporized. For example, the process liquid may be heated and vaporized in the process chamber 30 by heating a joint portion between the process liquid supply nozzle 339 and the process chamber 30 [process tube 360].

In the previous embodiment, a case in which a process liquid, for example, oxygenated water or water, is evaporated and vaporized by heating to generate a gas or a case in which a water-vaporized gas ($H_2O$) is generated by heating reactants of oxygen gas and hydrogen gas has been described, but the present invention is not limited thereto. For example, by applying ultrasonic waves to a process liquid, such as oxygenated water or water, the process liquid may change into a mist in the process chamber 30. Alternatively, a mist may be sprayed using an atomizer. Also, laser beams or microwaves may be directly radiated to the process liquid in the process chamber 30 to evaporate and vaporize the process liquid in the process chamber 30.

Also, for example, in the above-described embodiment, thermal treatment may be performed between the modification process S40 and the purge process S50. That is, for example, an annealing process (thermal treatment) may be performed by heating the wafer 12 to a high temperature.

In the thermal treatment process, to begin with, the inside of the process chamber 30 is heated by at least the first heating unit 320 to a predetermined temperature of, for example, 600° C. to 1100° C. Also, by operating at least one of the vacuum pump 405 or the vacuum pump 408, the inside of the process chamber 30 is adjusted to a predetermined pressure of, for example 6000 Pa to 60000 Pa. When the inside of the process chamber 30 reaches a predetermined temperature and a predetermined pressure, the valve 213c and the valve 208 are opened while exhausting the inside of the process chamber 30 via the exhaust unit, and the supply of an inert gas from the inert gas supply pipe 340c into the process chamber 30 starts. Also, while the inside of the process tube 360 is maintained at a predetermined temperature and a predetermined pressure, thermal treatment is performed for a predetermined time of, for example, 5 minutes to 120 minutes. After the predetermined time has elapsed, the supply of power into at least the first heating unit 320 is stopped. For example, the thermal treatment process may be performed at a temperature of about 800° C. under a pressure atmosphere of 53,200 Pa for about 30 minutes.

During the thermal treatment process, the supply of power to the sub-heaters 210a, 210d, and 210e, the liquefaction prevention heater 280, and the exhaust tube heater 411 may be stopped. In this case, the supply of power to the respective heaters may be stopped simultaneously or each stopped at a different time point. Also, for example, since gases flow into the first exhaust pipe 346 in the thermal treatment process, power may be supplied to the exhaust tube heater 411, and the supply of power to the sub-heaters 210a, 210d, and 210e and the liquefaction prevention heater 280 may be stopped.

When the thermal treatment is performed, as described above, while decreasing the temperature of the wafer 12 in the temperature decrease and atmospheric pressure recovery process S60, the shutter 359 may be opened to supply $N_2$ gas as a cooling as from the cooling gas supply pipe 363 into a space 352 between the process tube 360 and the heat insulating member 300. Thus, the process tube 360 and the first heating unit 320 installed in the space 352 may be cooled in a shorter period of time. As a result, a time point at which the next modification process S40 begins may be advanced to improve throughput.

By performing the thermal treatment process as described above, elements of the silicon-containing film that are not completely oxidized in the modification process S40 may be oxidized. That is, by performing the thermal treatment process, for example, impurities, such as nitrogen or hydrogen, or other impurities may be removed from the silicon-containing film present in the deepest portion of the groove of the wafer 12. Accordingly, the film quality of a silicon oxide film may be further improved. That is, the silicon-containing film may be sufficiently oxidized, densified, and cured. As a result, the silicon oxide film may obtain good wafer etch rate (WER) characteristics as an insulating film. Also, a WER has a high dependence on a final annealing temperature, and WER characteristics become higher as a temperature increases.

For example, after the above-described substrate unloading process S70, a cleaning process of cleaning the inside of the process tube 360 may be performed. By performing the cleaning process, impurities remaining in the process tube 360, the boat 14, and the first exhaust pipe 346 may be removed, so that corrosion of members installed in the process tube 360 can be prevented.

In the previous embodiment, constitutional members [e.g., the inner surface of the process liquid supply pipe 340a or the props 14a of the boat 14] in contact with the process liquid are formed of a material having low reactivity to the process liquid, but the present invention is not limited thereto. In addition, constitutional members in contact with the process liquid may be formed of a metal material, and a coating film formed of a material having low reactivity to the process liquid may be formed on the metal material. For example, when the constitutional members in contact with the process liquid are formed of aluminum, alumite ($Al_2O_3$), or stainless steel as the metal material, a chromium oxide film may be formed on the metal material. Also, among the constitutional members in contact with the process liquid, an unheated element may be formed of a plastic as a material having low reactivity to the process liquid.

Although the previous embodiment has been described as a case in which the evaporator 342 is installed to be supported by the prop 14a of the boat 14, the present invention is not limited thereto. That is, for example, the evaporator 342 may be installed within the process tube 360 in an upper portion of the process tube 360.

Although the previous embodiment has been described as a case in which the prop 14a and the substrate supporting unit 14b are independently configured, the present invention is not limited thereto. That is, the prop 14a and the substrate supporting unit 14b may be formed as a unified type. For example, a groove which is the substrate supporting unit 14b is installed in the prop 14a, and may be configured to support the wafer 12.

In the previous embodiment, a case in which a silicon-containing film formed on the wafer 12 contains, for example, polysilazane has been described, but the present invention is not limited thereto. That is, for example, a film which may be oxidized using, for example, an oxidizer liquid such as oxygenated water may be formed on the wafer 12. For example, a plasma polymerization film of trisilylamine (TSA) or ammonia may be used.

In the previous embodiment, a case in which a polysilazane film which is a silicon-containing film is formed on the wafer 12 using, for example, a liquid (silicon-containing material) obtained by dissolving a silicon material such as polysilazane ($SiH_2NH$) in a solvent such as xylene ($C_8H_{10}$) has been described, but the present invention is not limited thereto. In addition, for example, hexamethyldisilazane (HMDS), hexamethylcyclotrisilazane (HMCTS), polycarbosilazane, polyorganosilazane, or trisilyl amine (TSA) may be used as the silicon material. Also, an organic solvent, such as toluene ($C_6H_5CH_3$) or dibutyl ether ($C_8H_{18}O$), may be used as the solvent.

In the previous embodiment, a case in which a polysilazane film which is a silicon-containing film is formed on the wafer 12 by coating a polysilazane-containing liquid on the wafer 12 using a spin coating apparatus has been described, but the present invention is not limited thereto. In addition, for example, a silicon-containing film may be formed on the wafer 12 by CVD using a silicon (Si) source, such as monosilane (SiH$_4$) gas or TSA gas. Also, for example, a wafer 12 on which a silicon-containing film such as a polysilicon film is previously formed may be used.

In the previous embodiment, a case in which the process liquid supply nozzle 339 or the process liquid supply pipe 340a is installed in a position opposite to the first exhaust pipe 346 has been described, but the present invention is not limited thereto. For example, the process liquid supply nozzle 339 or the process liquid supply pipe 340a may be installed at the same side as the first exhaust pipe 346. Thus, spatial economization of the substrate processing apparatus 10 may be promoted. Also, because the process liquid supply nozzle 339 or the process liquid supply pipe 340a is disposed close to the first exhaust pipe 346, time required for maintenance may be reduced to improve throughput.

In the previous embodiment, each of the sub-heaters 210a, 210d, and 210e, the liquefaction prevention heater 280, and the exhaust tube heater 411 is electrically connected to the controller 500, and the controller 500 is configured to control power supplied into each of the sub-heaters 210a, 210d, and 210e, the liquefaction prevention heater 280, and the exhaust tube heater 411 based on temperature information detected by a temperature sensor connected to each of the sub-heaters 210a, 210d, and 210e, the liquefaction prevention heater 280, and the exhaust tube heater 411. However, the present invention is not limited thereto. For example, a liquefaction prevention control device which is a liquefaction prevention controller may be installed and control each of the sub-heaters 210a, 210d, and 210e, the liquefaction prevention heater 280, and the exhaust tube heater 411 to have a predetermined temperature.

A temperature detector configured to detect temperatures of the liquefaction prevention heater 280, the exhaust tube heater 411, and the sub-heaters 210a, 210d, and 210e is installed at the liquefaction prevention control device. The temperature detector includes, for example, a sheathed thermocouple. The amount of power supplied into each of the liquefaction prevention heater 280, the exhaust tube heater 411, and the sub-heaters 210a, 210d, and 210e is controlled based on the temperature detected by the temperature detector. For example, a control operation (ON/OFF control) is performed to supply power into each of the liquefaction prevention heater 280, the exhaust tube heater 411, and the sub-heaters 210a, 210d, and 210e when each of the heaters has a temperature of 100° C. or less, and stop the supply of power into each of the liquefaction prevention heater 280, the exhaust tube heater 411, and the sub-heaters 210a, 210d, and 210e when each of the heaters has a temperature of 300° C. or more. For example, feedback control, such as proportional integral differential (PID) control, may be performed, and power supplied into each of the sub-heaters 210a, 210d, and 210e, the liquefaction prevention heater 280, and the exhaust tube heater 411 may be controlled such that each of the heaters is maintained at a predetermined temperature of, for example, 200° C. Also, for example, the liquefaction prevention heater 280 may perform the above-described ON/OFF control at least during the modification process S40, and the supply of power into the liquefaction prevention heater 280 may be stopped when the wafer 12 is not contained in the process chamber 30 or when the wafer 12 is processed at a temperature of 400° C. or higher.

In addition, for example, a seal cap protector may be installed on the seal cap 344 to protect the seal cap 344 from a process liquid, a gas of the process liquid, and a liquid obtained by re-liquefying the gas of the process liquid (hereinafter, also referred to as a process liquid and the like). The seal cap protector is formed of a material which hardly reacts with the process liquid and the like, for example, a nonmetal material such as quartz (SiO$_2$). An O-ring may be installed between the lower end of the process tube 360 and the seal cap protector and the seal cap 344 to maintain the airtightness of the inside of the process chamber 30. A cooling flow line through which cooling water for cooling the seal cap 344 or the seal cap protector flows may be installed in the seal cap 344 or the seal cap protector. Thus, deformation of the seal cap 344 or deterioration of the O-ring due to heat emitted from the first through fourth heater units 320a to 320d or the liquefaction prevention heater 280 may be prevented. When re-liquefaction of the gas of the process liquid occurs on the surface of the seal cap 344 by cooling the seal cap 344 or the seal cap protector, a thermal conducting unit may be installed on the seal cap protector and easily heat the surface of the seal cap protector. The thermal conducting unit may be formed of, for example, the same material as the boat 14, such as silicon carbide (SiC), aluminum oxide (AlO), aluminum nitride (AlN), boron nitride (BN), silicon nitride (SiN), zirconium oxide (ZrO), or a nonmetal material having high thermal conductivity, for example, a carbon material such as graphite or glassy carbon. In particular, the thermal conducting unit may be formed of a material having a thermal conductivity of 5 W/mK or more. Also, the thermal conducting unit may be in contact with the gas of the process liquid. Accordingly, the thermal conducting unit may be more preferably formed of a material that does not react with the process liquid (the gas of the process liquid). Also, the thermal conducting unit may be formed of a member having conductivity, and configured to be self-heated in the thermal conducting unit when supplying current to the thermal conducting unit. Also, an evaporation area may be increased by installing a porous structure in the thermal conducting unit.

Other Embodiments of the Present Invention

In the previous embodiment, a case in which a process liquid is supplied into the process tube 360 and evaporated and vaporized in the process tube 360 to generate a gas of a process liquid has been described, but the present invention is not limited thereto. For example, a process liquid may be vaporized outside the process tube 360 and a gas of the process liquid may be supplied into the process tube 360. Also, in the present embodiment, a case in which oxygenated water is used as the process liquid will be described as an example.

Figure 6:
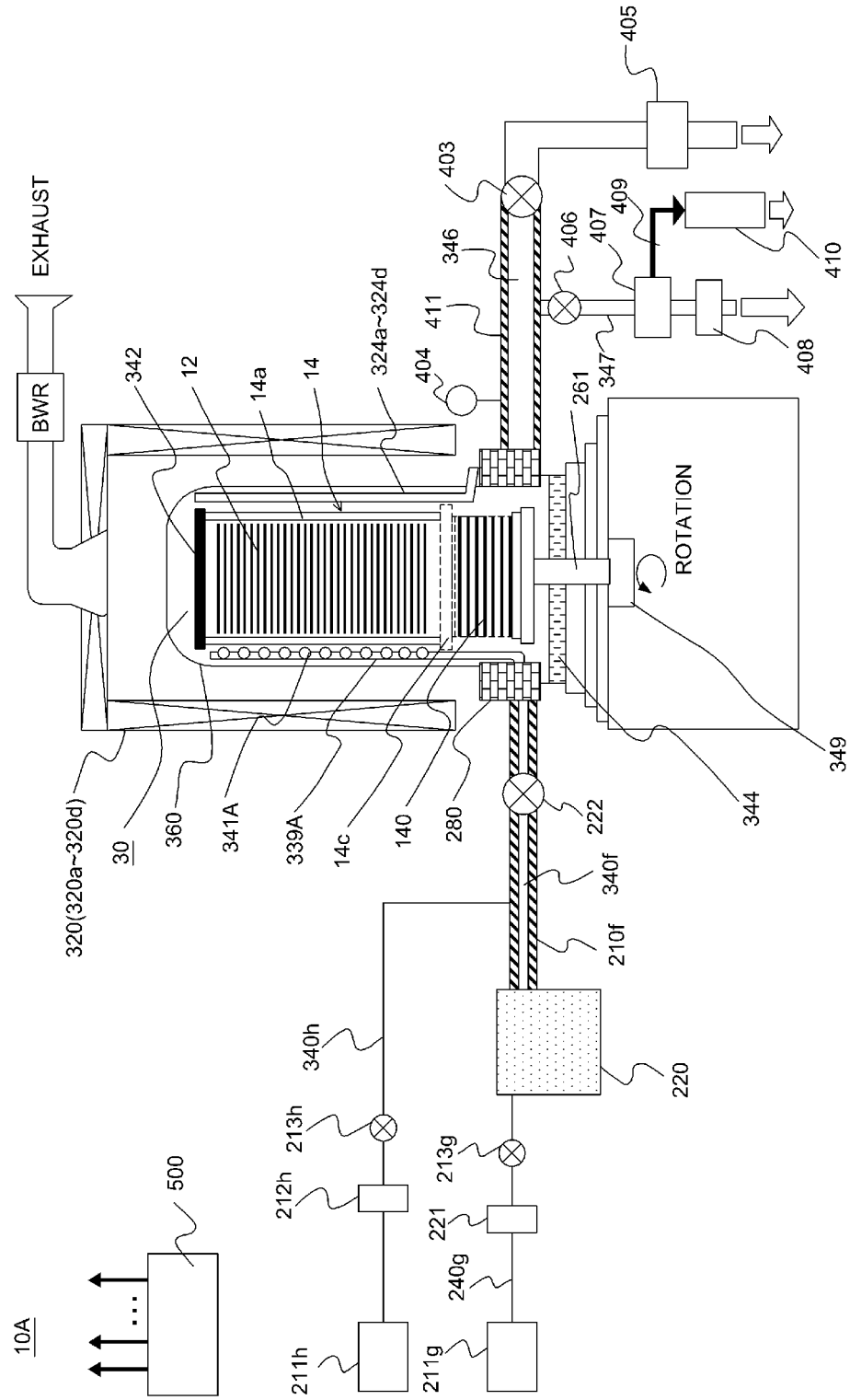
FIG. 6 is a schematic configuration diagram of a substrate processing apparatus according to another exemplary embodiment of the present invention.
Figure 7:
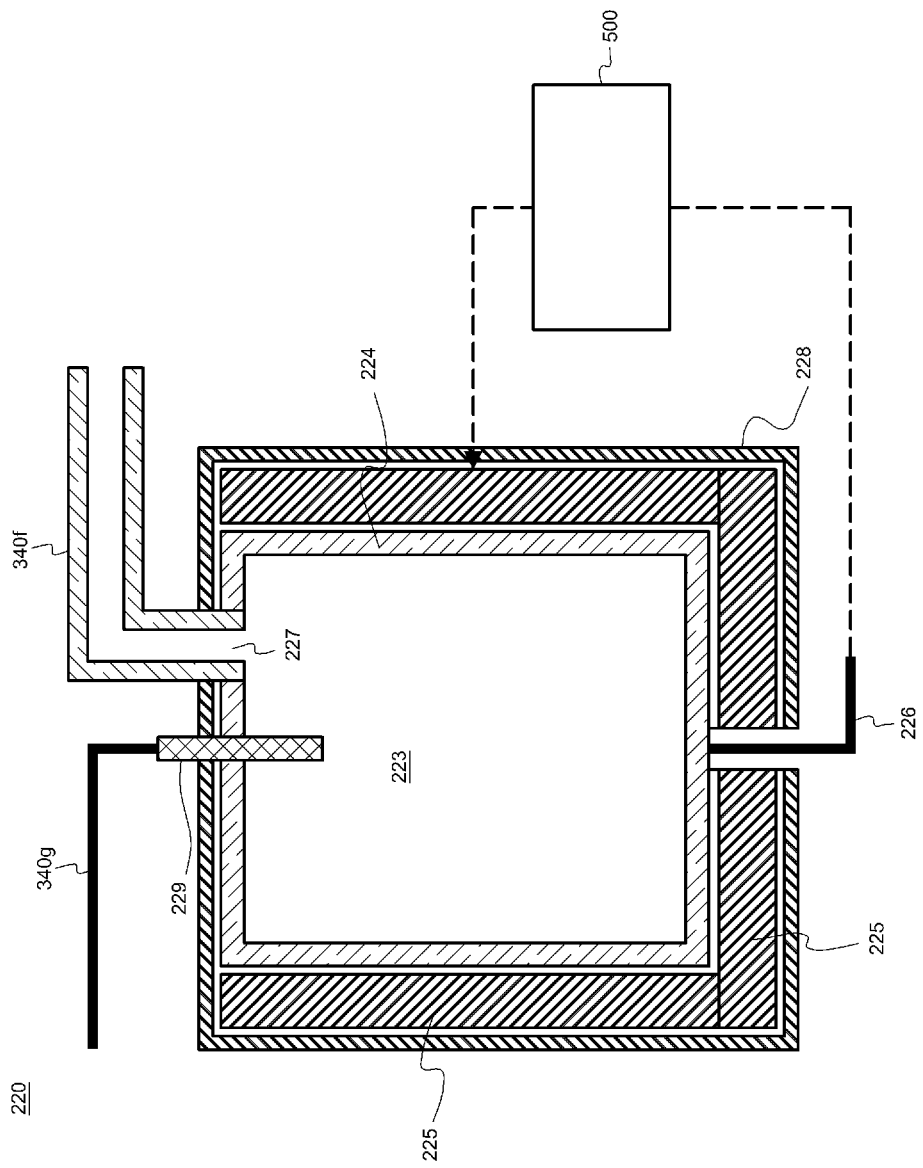
FIG. 7 is a schematic diagram of an overheated water vapor generating device included in a substrate processing apparatus according to another exemplary embodiment of the present invention.

FIG. 6 is a schematic configuration diagram of a substrate processing apparatus 10A according to another exemplary embodiment of the present invention. FIG. 7 is a schematic diagram of an overheated water vapor generating device included in the substrate processing apparatus 10A according to another exemplary embodiment of the present invention. The present embodiment has the same configuration as the previous embodiment except for a supply unit. Accordingly, a description of the same components as in the previous embodiment is omitted.

Supply Unit

As illustrated in FIG. 6, a gas supply nozzle 339A is installed in the process tube 360 to penetrate a lower portion of the process tube 360. The gas supply nozzle 339A is installed in a space between the process tube 360 and the boat 14 to rise upward in a direction in which the wafers 12 are stacked, from a lower portion of an inner wall of the process tube 360 to an upper portion thereof.

Supply holes 341 are formed in a side surface of a vertical portion of the gas supply nozzle 339A to supply gases into the process tube 360. A plurality of supply holes 341 are open toward the centers of the wafers 12 in a direction in which the wafers 12 are stacked (a vertical direction). The gas supply holes have the same opening area and are installed at the same opening pitch. Gas supply holes 341 may have gradually larger opening diameters from a lower portion to an upper portion so that a gas in the process tube 360 can have a proper flow rate distribution or speed distribution.

Overheated Water Vapor Supply Unit

A downstream end of an overheated water vapor supply pipe 340f is connected to an upstream end of the gas supply nozzle 339A. An overheated water vapor generating device 220 and a valve 221 which is an opening/closing valve are installed at the overheated water vapor supply pipe 340f. Also, a sub-heater 210f, for example, an inlet tube heater, is installed at the overheated water vapor supply pipe 340f downstream from at least the overheated water vapor generating device 220. The sub-heater 210f is configured such that the overheated water vapor supply pipe 340f may be heated to a predetermined temperature of, for example, 50° C. to 300° C., to prevent a gas of oxygenated water generated by the overheated water vapor generating device 220 from being re-liquefied (condensation) in the overheated water vapor supply pipe 340f.

A spot at which the overheated water vapor supply pipe 340f is in contact with oxygenated water or the gas of the oxygenated water, that is, an inner surface of the overheated water vapor supply pipe 340f, may be formed of a material having low reactivity to the oxygenated water or the gas of the oxygenated water. The inner surface of the overheated water vapor supply pipe 340f may be formed of, for example, a material containing at least one of Teflon (a registered trademark), quartz, and ceramics, such as aluminum oxide ($Al_2O_3$), aluminum nitride (AlN), and silicon carbide (SiC). Thus, corrosion of the overheated water vapor supply pipe 340f may be inhibited. Also, when a metal member is used as the overheated water vapor supply pipe 340f, an anti-reaction coating film may be formed on the inner surface of the overheated water vapor supply pipe 340f to prevent a reaction of the metal member with the oxygenated water or the gas of the oxygenated water. The anti-reflection coating film may be formed of, for example, a material having low reactivity to the gas of the process liquid, for example, Teflon (a registered trademark).

The gas of the oxygenated water generated by the overheated water vapor generating device 220 is supplied from the overheated water vapor supply pipe 340f via the valve 222, the gas supply nozzle 339A, and supply holes 341A into the process tube 360.

An oxygenated water supply pipe 340g configured to supply oxygenated water is connected to the overheated water vapor generating device 220. An oxygenated water supply source 211g, a liquid mass flow controller 221, and a valve 213g which is an opening/closing valve are sequentially installed at the oxygenated water supply pipe 340g in an upstream direction. Oxygenated water is supplied from the oxygenated water supply pipe 340g via the liquid mass flow controller 221 and the valve 213g into the overheated water vapor generating device 220.

A overheated water vapor supply unit is mainly configured by the overheated water vapor supply pipe 340f, the valve 221, and the gas supply nozzle 339A. Also, the overheated water vapor supply unit may further include the overheated water vapor generating device 220. Also, an oxygenated water supply unit is mainly configured by the liquid mass flow controller 221 and the valve 213g. The oxygenated water supply unit may further include an oxygenated water supply source 211g. Also, the overheated water vapor supply unit may further include the oxygenated water supply unit.

Inert Gas Supply Unit

A downstream end of an inert gas supply pipe 340h is connected between the overheated water vapor generating device 220 of the overheated water vapor supply pipe 340f and the valve 209. An inert gas supply source 211h, a mass flow controller 212h, which is a flow rate controller (flow rate control unit), and a valve 213h which is an opening/closing valve are sequentially installed at the inert gas supply pipe 340h in an upstream direction.

An inert gas is supplied from the inert gas supply pipe 340h via the mass flow controller 212h, the valve 213h, the overheated water vapor supply pipe 340f, and the gas supply nozzle 339A into the process tube 360. As the inert gas, for example, nitrogen ($N_2$) gas or a rare gas, such as He gas, Ne gas, or Ar gas, may be used.

An inert gas supply unit is mainly configured by the inert gas supply pipe 340h, the mass flow controller 212h, and the valve 213h. Also, the inert gas supply unit may further include the inert gas supply source 211h or include the overheated water vapor supply pipe 340f and the gas supply nozzle 339A.

Also, the supply unit according to the present embodiment is mainly configured by the overheated water vapor supply unit and the inert gas supply unit.

Overheated Water Vapor Generating Device

Next, configuration of the overheated water vapor generating device 220 will be described with reference to FIG. 7. As illustrated in FIG. 7, the overheated water vapor generating device 220 uses a drop-weight method in which oxygenated water which is a process liquid is dropped on a member heated by a heating mechanism to vaporize the oxygenated water which is the process liquid.

The overheated water vapor generating device 220 includes an evaporation container 224, which constitutes a process space 223 (evaporation space). As a material forming the evaporation container 224, for example, quartz or silicon carbide having low reactivity to the oxygenated water which is the process liquid may be used. A temperature of the evaporation container 224 may be decreased due to the temperature of the oxygenated water supplied into the evaporation container 224 or due to the heat of evaporation of oxygenated water in some cases. Accordingly, to prevent the temperature in the evaporation container 224 from decreasing, silicon carbide having high thermal conductivity is used more preferably as a material forming the evaporation container 224.

An evaporation heater 225 which is a heating unit configured to heat the evaporation container 224 is installed outside the evaporation container 224 to surround a sidewall surface and a bottom surface of the evaporation container 224. The evaporation container 224 is configured to be heated by the evaporation heater 225 to such a temperature that oxygenated water supplied into the evaporation container 224 may be vaporized simultaneously (in a moment) the oxygenated water reaches an inner wall of the evaporation container 224. A temperature sensor 226, for example, a thermocouple, is installed in the center of a lower portion of the evaporation container 224 to measure the temperature in the evaporation container 224. A controller 500 is electrically connected to the temperature sensor 226. The controller 500 is configured to control power supplied into the evaporation heater 225 based on temperature information detected by the temperature sensor 226 such that the inside of the evaporation container 224 has a predetermined temperature.

A drop nozzle 229 is installed in an upper portion of the evaporation container 224 to supply oxygenated water into the evaporation space 223. An upstream end of the drop nozzle 229 is connected to a downstream side of the oxygenated water supply pipe 340g.

Also, an exhaust port 227 is installed in the upper portion of the evaporation container 224. An upstream end of the overheated water vapor supply pipe 340f is connected to the exhaust port 227. That is, the gas (water vapor of the oxygenated water) of the oxygenated water generated in the evaporation container 224 is supplied via the exhaust port 227, the overheated water vapor supply pipe 340f, and the gas supply nozzle 341A into the process tube 360.

A heat insulating material 228 is installed around the evaporation container 224 to prevent heat generated by the evaporation heater 225 from being transmitted to, for example, other constitutional members of the substrate processing apparatus 10A. Also, by installing the heat insulating material 228, heating efficiency of the inside of the evaporation container 224 due to the evaporation heater 225 may be improved.

Next, a substrate processing process including a modification process of modifying, for example, a silicon-containing film formed on the wafer 12 into a silicon oxide film using the substrate processing apparatus 10A will be described. Also, the substrate processing process according to the present embodiment is the same as the above-described substrate processing process except for a modification process S40. Accordingly, a description of the same components as in the previous embodiment is omitted.

Modification Process (S40)

When the wafer 12 is heated to a predetermined temperature and the boat 14 reaches a predetermined rotation speed, the supply of a gas of oxygenated water from the overheated water vapor supply pipe 340f into the process tube 360 begins. That is, the valve 213g is opened, and oxygenated water, the flow rate of which is controlled by the liquid mass flow controller 221, is supplied via the drop nozzle 229 from the oxygenated water supply source 211f to the evaporation container 224 included in the overheated water vapor generating device 220. In this case, the inside of the evaporation container 224 is preheated by the evaporation heater 225 to reach a predetermined temperature of, for example, 150° C. to 170° C. Thus, when the oxygenated water supplied into the evaporation container 224 is brought into contact with the inner wall (e.g., a bottom wall) of the evaporation container 224, the oxygenated water is heated in a moment and evaporated and vaporized to generate the gas of the oxygenated water.

The valve 213g and the valve 222 are opened simultaneously, and the gas of the oxygenated water generated in the evaporation container 224 is supplied from the overheated water vapor supply pipe 340f via the gas supply nozzle 339A and the supply holes 341A into the process tube 360 [process chamber 30]. Also, the gas of the oxygenated water is supplied onto the wafer 12 contained in the process tube 360. When the gas of the oxygenated water supplied onto the wafer 12 causes an oxidation reaction with the surface of the wafer 12, the silicon-containing film formed on the wafer 12 is modified into a silicon oxide film (SiO film).

After a predetermined time has elapsed, the valve 213g is closed, the supply of the oxygenated water into the overheated water vapor generating device 220 is stopped. Concurrently, the valve 222 is closed to stop the supply of the gas of the oxygenated water into the process tube 360.

As described above, even if the gas of the oxygenated water which is a process liquid is generated outside the process tube 360 and supplied into the process tube 360, oxygen atoms may be supplied to, for example, the silicon-containing film formed on a bottom portion of the groove having the fine structure formed in the wafer 12. Accordingly, uniform oxidation may be performed on the silicon-containing film formed on the wafer 12, and an oxide film which is a high-quality dense film may be formed on the wafer 12.

In the previous embodiment, a case in which oxygenated water is supplied to the overheated water vapor generating device 220, and a gas of the oxygenated water is generated by the overheated water vapor generating device 220 has been described, but the present invention is not limited thereto. For example, an ozone ($O_3$)-containing liquid or water $H_2O$ may be supplied to the overheated water vapor generating device 220, and an ozone-containing gas or water vapor may be generated by the overheated water vapor generating device 220 and supplied into the process tube 360.

Another Embodiment of the Present Invention

Figure 8:
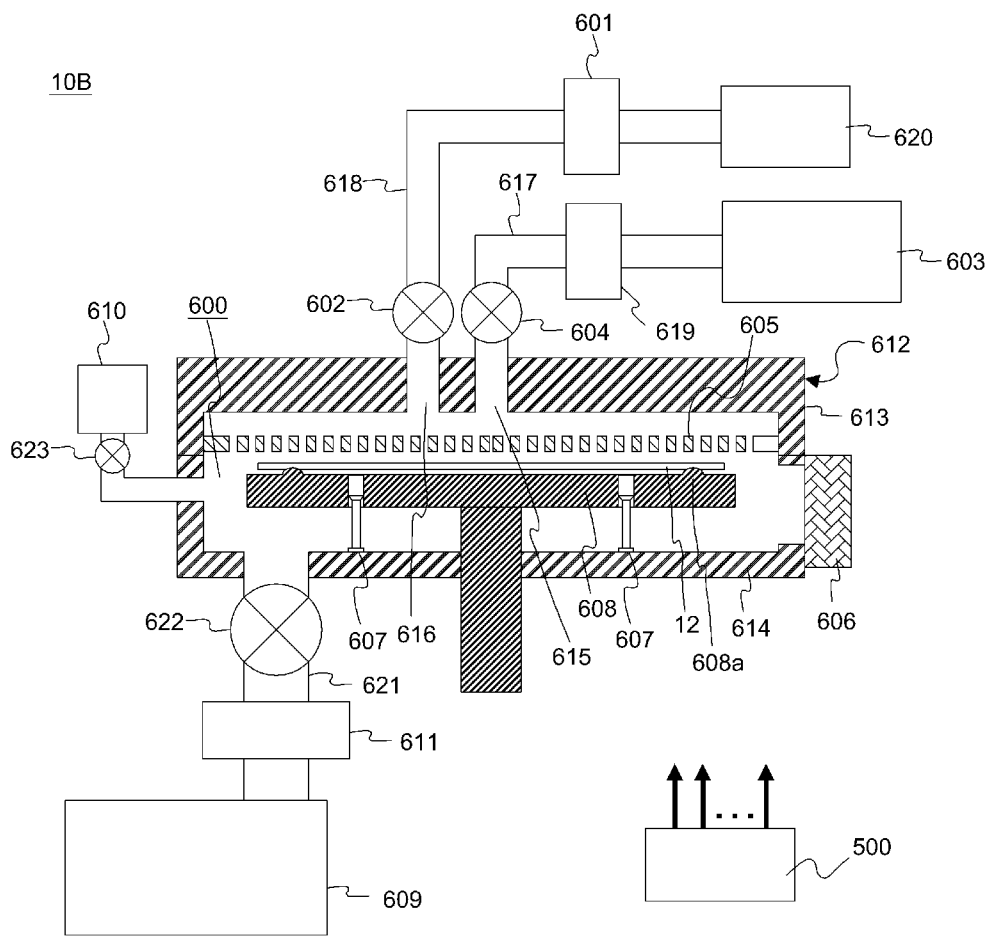
FIG. 8 is a schematic longitudinal sectional diagram of a process chamber included in a substrate processing apparatus according to another exemplary embodiment of the present invention.

Although the previous embodiment has been described as a substrate processing apparatus including a longitudinal process chamber 30, the present invention is not limited thereto, and another apparatus may be used. Hereinafter, a substrate processing apparatus including a single-wafer-type process chamber will be described with reference to FIG. 8. FIG. 8 is a schematic longitudinal sectional view of a process chamber 600 included in a substrate processing apparatus 10B according to the present embodiment.

As illustrated in FIG. 8, a process container 612 constituting the process chamber 600 includes a dome-type upper container 613 and a bowl-type lower container 614. The upper container 613 is coated on the lower container 614 to form the process chamber 600. A heating mechanism configured to heat the inside of the process container 612 may be installed at the process container 612 to prevent re-liquefaction (condensation) of, for example, a process liquid, such as a gas of oxygenated water, in the process container 612. For example, the inside of the process container 612 may be heated by closely adhering a resistive heater to the outside of the process container 612 or by letting a temperature control liquid or gas flow into a flow line installed at the process container 612.

A gate valve 606 which is a gate valve is installed at a sidewall of the lower container 614. The process chamber 600 is installed to be capable of communicating with a transfer chamber included in the substrate processing apparatus 10B via the gate valve 606. When the gate valve 606 is opened, a wafer 12 may be loaded into the process chamber 600 or unloaded to the outside of the process chamber 600 by a transfer arm which is a transfer robot. Also, the inside of the process chamber 600 may be air-tightly sealed by closing the gate valve 606.

A susceptor 608 configured to support the wafer 12 is disposed in the center of a lower portion of the process chamber 600. A plurality of small protrusions 608a are installed on a surface of the susceptor 608 by which the wafer 12 is supported. Thus, the area of the wafer 12 in contact with the susceptor 608 may be reduced. The susceptor 608 is formed of a nonmetal material to reduce contamination of the wafer 12 with metals. At least the surface of the susceptor 608 may be coated with a coating film formed of silicon carbide. Thus, for example, when a gas of a process liquid, such as oxygenated water, is brought into contact with the susceptor 608, degradation of the susceptor 608 may be inhibited.

A plurality of through holes may be installed in the susceptor 608. A plurality of support pins 607 configured to move the wafer 12 upward/downward and support a reverse surface of the wafer 12 are installed in positions of a bottom surface of the lower container 614 corresponding to the through holes. The wafer 12 loaded into the process chamber 600 by the transfer arm is placed on the support pins 607.

Also, when the susceptor 608 is moved upward, the wafer 12 may be disposed on a top surface of the susceptor 608.

A heater which is a heating mechanism is buried as a unified type in the susceptor 608, and configured to heat the wafer 12. When power is supplied to the heater, the surface of the wafer 12 is heated to a predetermined temperature.

A process liquid gas supply unit and an inert gas supply unit are respectively air-tightly installed at an upper portion of the upper container 613 via openings 615 and 616 installed in a top surface of the upper container 613. That is, a downstream end of a gas supply pipe 617 is air-tightly installed at the opening 615. Also, a downstream end of an inert gas supply pipe 618 is air-tightly installed at the opening 616.

A gas generator 603 configured to generate a gas of a process liquid, an mass flow controller 619 which is a flow rate control device, and a valve 604 which is an opening/closing valve are sequentially installed at the process gas supply pipe 616 from an upstream end. A gas (a gas of a process liquid) generated by the gas generator 603, for example, a gas obtained by evaporating oxygenated water, which is the process liquid, or water vapor is supplied from the process gas supply pipe 616 via the mass flow controller 619, the valve 604, and the opening 615 into the process chamber 600.

The process liquid gas supply unit is mainly configured by the gas supply pipe 617, the mass flow controller 619, and the valve 604. Also, the gas supply unit may further include the gas generator 603 and the opening 615.

An inert gas supply source 620, an mass flow controller 601 which is a flow rate control device, and a valve 602 which is an opening/closing valve are sequentially installed at the inert gas supply pipe 618 from an upstream end. An inert gas, for example, nitrogen ($N_2$) gas, is supplied from the inert gas supply pipe 618 via the mass flow controller 601, the valve 602, and the opening 616 into the process chamber 600. As the inert gas, for example, $N_2$ gas or a rare gas, such as He gas, Ne gas, or Ar gas, may be used.

In the present embodiment, when the gas of the process liquid is supplied from the process gas supply pipe 616 into the process chamber 600, nitrogen ($N_2$) gas or Ar gas may be concurrently supplied as a foaming gas into the process chamber 600.

The inert gas supply unit is mainly configured by the inert gas supply pipe 618, the mass flow controller 601, and the valve 602. Also, the inert gas supply unit may further include the inert gas supply source 620 and the opening 616.

A gas dispersing plate 605 is installed in an upper portion of the process chamber 600 to disperse a gas of the process liquid or an inert gas supplied into the process chamber 600 within the process chamber 600. Thus, the gas of the process liquid may be uniformly supplied to an in-plane surface of the wafer 12. Also, the gas dispersing plate 605 may not be installed depending on process conditions.

An upstream end of an exhaust pipe 621 configured to exhaust an atmosphere in the process chamber 600 is connected to the process container 612. A valve 622 which is an opening/closing valve, an APC valve 611 which is a pressure regulator, and a vacuum pump 609 which is a vacuum exhaust device are sequentially installed at the exhaust pipe 621 in an upstream direction. The exhaust pipe 621 is configured such that the inside of the process chamber 600 is vacuum-exhausted by the vacuum pump 609 to have a predetermined pressure. Also, a pressure gauge 610 (pressure sensor) which is a pressure detector configured to detect a pressure in the process chamber 600 is connected to the process container 612 via a valve 623. A controller 500 is electrically connected to the pressure gauge 610 and the APC valve 611. The controller 500 is configured to control an opening rate of the APC valve 611 based on pressure information detected by the pressure gauge 610 such that the inside of the process chamber 600 has a predetermined pressure at a predetermined time point.

As described above, even if a substrate processing apparatus is configured such that a gas of oxygenated water which is a process liquid is generated outside the process tube 360, and supplied into the process tube 360, oxygen atoms may be uniformly supplied to a film formed on the wafer 12. Accordingly, the film quality of an oxide film formed on the wafer 12 may be improved.

Another Embodiment of the Present Invention

In the previous embodiment, a process of forming an oxide film, which is an insulating film, in a fine groove formed in a wafer 12 has been described as an example of a semiconductor device manufacturing process for processing the wafer 12, but the present invention is not limited thereto. In addition, the present invention is also applicable to, for example, a process of forming an interlayer dielectric (ILD) of a substrate of a semiconductor device or a process of encapsulating a semiconductor device.

In the previous embodiment, a semiconductor device manufacturing process has been described, but the present invention is not limited thereto. In addition, the present invention is also applicable to, for example, a process of encapsulating a substrate including liquid crystals in a process of manufacturing a liquid crystal display (LCD) device or a process of waterproof-coating a glass substrate or ceramic substrate used for various devices. Also, the present invention is applicable to a process of waterproof-coating a mirror.

EXAMPLE

Next, an experimental example of the present invention will be described with reference to FIG. 9. FIG. 9 shows values of physical properties of quartz (SiO), silicon carbide (SiC), and aluminum oxide (AlO).

To begin with, a quartz plate was installed on a heater which was set to a temperature equal to or higher than the boiling point of water, which was a process liquid, in an atmospheric pressure environment. Then, by bringing a thermocouple into contact with a surface of the quartz plate, it was confirmed that quartz was heated to a temperature equal to or higher than the boiling point of water. Next, water droplets were dropped on the quartz plate. In this case, the water droplets were dropped to be in contact with a front end of the thermocouple. Then, a change in the temperature of the surface of the quartz plate (temperature exhibited by the thermocouple) over time was measured. At the beginning of the dropping of the water droplets, the water droplets boiled in an extremely short period of time. That is, the water droplets were evaporated and vaporized in an extremely short period of time and turned into water vapor. Thereafter, the water droplets were continuously dropped, and as a time elapsed, it was confirmed that the water droplets did not boil (evaporate) but gradually dried on the quartz plate. In this case, at the beginning of the dropping of the water droplets, a temperature of the surface of the quartz plate exceeded a temperature of about 100° C. (the boiling point of water). However, it was confirmed that the surface of the quartz plate had a temperature of about 70° C. when the water droplets no longer evaporated. Also, when the water droplets were completely evaporated and disappeared from the surface of the quartz plate, it was confirmed that quartz was heated by the heater and the surface of the quartz plate returned to a temperature of about 100° C. or more. That is, it was confirmed that the quartz plate was cooled by evaporation latent heat contained in water (process liquid).

Next, the same experiment was conducted by installing a silicon carbide plate on a heater instead of the quartz plate. Similar to the quartz plate, a decrease in temperature occurred in the silicon carbide plate due to evaporation latent heat with the dropping of water droplets. However, it was confirmed that the silicon carbide plate could evaporate the water droplets more rapidly than the quartz plate. As a result, it was confirmed that even if a decrease in temperature occurred, the silicon carbide plate was recovered to an original temperature faster than the quartz plate. This is because silicon carbide is about 100 times as thermally conductive as quartz as illustrated in FIG. 9.

Accordingly, it is confirmed that adopting silicon carbide which is a material having a high thermal conductivity is preferable as constitutional members (e.g., the evaporator 342 or the boat 14) installed in the process tube 360. Thus, re-liquefaction of the gas of the process liquid in the process tube 360 may be inhibited.

As illustrated in FIG. 9, quartz or aluminum oxide has a lower thermal conductivity than silicon carbide. Thus, a constitutional member, which is formed of quartz or aluminum oxide and installed in the process tube 360, may be cooled to a temperature equal to or lower than the boiling point of the process liquid due to latent heat of evaporation of the process liquid. As a result, it is inferred that an evaporation rate of the process liquid may be reduced. Also, when the gas of the process liquid is brought into contact with the constitutional member installed in the process tube 360, it is inferred that the gas of the process liquid may be re-liquefied.

In contrast, when the constitutional member installed in the process tube 360 is formed of, for example, quartz, after the constitutional member is cooled by evaporation latent heat contained in a gas of a process liquid, it takes quite a while to recover the constitutional member to an original temperature. Accordingly, it is inferred that the constitutional member may be cooled to a temperature equal to or lower than the boiling point of the process liquid. As a result, re-liquefaction of oxygenated water which is the process liquid is apt to occur at a spot of the constitutional member, which is cooled to a temperature equal to or lower than the boiling point of the process liquid, or the vicinity thereof. In particular, when the oxygenated water is used as the process liquid, the re-liquefaction of the oxygenated water is liable to occur because hydrogen peroxide has a higher boiling point than water. Also, since re-liquefied oxygenated water contains hydrogen peroxide at a higher concentration than oxygenated water supplied into the process tube 360, the re-liquefied oxygenated water may have a strong oxidation property.

Also, since it takes a longer time to recover a member formed of quartz to an original temperature than a member formed of silicon carbide, there may be some cases in which it is difficult to re-vaporize a liquid generated by re-liquefying a gas of a process liquid. Thus, it is inferred that the liquid generated by re-liquefying the gas of the process liquid is apt to remain in the process tube 360, and a constitutional member installed in the process tube 360 is apt to corrode. Also, to prevent re-liquefaction of the gas of the process liquid in the process tube 360, it may be necessary to reduce the amount of the process liquid supplied into the process tube 360. As a result, it is inferred that processing the wafer 12 may take time.

Exemplary Embodiments

Exemplary embodiments of the present invention will be supplementarily described below.

Supplementary Note 1

According to one aspect of the present invention, there is provided an apparatus for manufacturing a semiconductor device, including: a process chamber configured to accommodate a substrate; a process liquid supply unit configured to supply a process liquid into the process chamber; a heating unit configured to heat the process liquid in the process chamber; and a substrate support disposed in the process chamber and configured to support the substrate.

Supplementary Note 2

It is preferable that the apparatus of Supplementary note 1 further includes a control unit configured to control the process liquid supply unit and the heating unit to heat the process liquid to heat and evaporate the process liquid in the process chamber by the heating unit.

Supplementary Note 3

In the apparatus of Supplementary note 1 or 2, the process liquid preferably includes hydrogen peroxide.

Supplementary Note 4

In the apparatus of Supplementary note 3, the process liquid preferably includes water.

Supplementary Note 5

In the apparatus of Supplementary note 1 or 2, the process liquid preferably includes water.

Supplementary Note 6

In the apparatus of any one of Supplementary notes 1 through 5, a silicon-containing film is preferably formed on the substrate.

Supplementary Note 7

In the apparatus of Supplementary note 6, the silicon-containing film preferably includes a silazane bond.

Supplementary Note 8

In the apparatus of Supplementary note 7, the film including the silazane bond preferably includes polysilazane.

Supplementary Note 9

In the apparatus of Supplementary note 8, the polysilazane-containing film is preferably formed by coating the substrate with a polysilazane-containing liquid or by a chemical vapor deposition (CVD) process using a silicon material.

Supplementary Note 10

In the apparatus of any one of Supplementary notes 1 through 9, it is preferable that an evaporator configured to receive the process liquid from the process liquid supply unit is disposed in the process chamber.

Supplementary Note 11

In the apparatus of Supplementary note 10, the evaporator preferably includes silicon carbide.

Supplementary Note 12

In the apparatus of Supplementary note 10 or 11, the evaporator is preferably disposed at the substrate support.

Supplementary Note 13

In the apparatus of Supplementary note 12, the evaporator is preferably disposed to be supported by the substrate support.

Supplementary Note 14

In the apparatus of any one of Supplementary notes 1 through 13, a substrate supporting unit is preferably disposed at the substrate support to support a plurality of substrates.

Supplementary Note 15

In the apparatus of Supplementary note 2, the process liquid preferably includes at least two materials having different boiling points, and the control unit is preferably configured to control the heating unit in a manner that a concentration of the process liquid before the process liquid is supplied into the heating unit is equal to that of the process liquid after the process liquid is evaporated.

Supplementary Note 16

According to one aspect of the present invention, there is provided a method of manufacturing a semiconductor device, including: a process liquid supplying step of supplying a process liquid into a process chamber accommodating a substrate from a process liquid supply unit; and a process liquid heating step of heating the process liquid by a heating unit in the process chamber.

Supplementary Note 17

In the method of Supplementary note 16, the process liquid heating step preferably includes generating a gas of the process liquid by evaporating the process liquid in the process chamber.

Supplementary Note 18

In the method of Supplementary note 16 or 17, the process liquid heating step preferably further includes supplying the process liquid to an evaporator disposed in the process chamber and heated by the heating unit.

Supplementary Note 19

In the method of Supplementary note 18, the evaporator is preferably disposed at a substrate support supporting the substrate in the process chamber.

Supplementary Note 20

In the method of Supplementary notes 16 through 19, the process liquid preferably includes hydrogen peroxide.

Supplementary Note 21

In the method of Supplementary notes 16 through 20, a silicon-containing film is preferably formed on the substrate.

Supplementary Note 22

In the method of Supplementary note 21, the silicon-containing film preferably includes a silazane bond.

Supplementary Note 23

In the method of Supplementary note 22, a film including the silazane bond preferably includes polysilazane.

Supplementary Note 24

According to another aspect of the present invention, there is provided a program that causes a computer to perform: a process liquid supplying sequence of supplying a process liquid from a process liquid supply unit into a process chamber accommodating a substrate; and a process liquid heating sequence of heating the process liquid in the process chamber by a heating unit.

Supplementary Note 25

According to another aspect of the present invention, there is provided a non-transitory computer-readable recording medium storing a program that causes a computer to perform: a process liquid supplying sequence of supplying a process liquid from a process liquid supply unit into a process chamber accommodating a substrate; and a process liquid heating sequence of heating the process liquid in the process chamber by a heating unit.

Supplementary Note 26

According to another aspect of the present invention, there is provided a process liquid supply unit including: a process liquid supply pipe configured to supply a process liquid into a process chamber accommodating a substrate; and a process liquid flow rate control unit disposed at the process liquid supply pipe and configured to control a flow rate of the process liquid supplied into the process chamber.

Supplementary Note 27

In the process liquid supply unit of Supplementary note 26, a surface of the process liquid supply pipe contacting the process liquid is preferably formed of a material having low reactivity to the process liquid.

Supplementary Note 28

In the process liquid supply unit of Supplementary note 27, the material having low reactivity to the process liquid preferably includes any one of Teflon, quartz and ceramics.

Supplementary Note 29

According to another aspect of the present invention, there is provided an evaporation unit configured to evaporate a process liquid supplied into a process chamber accommodating a substrate.

Supplementary Note 30

According to another aspect of the present invention, there is provided a substrate support supporting a substrate and including an evaporator configured to evaporate a process liquid for processing the substrate.

Supplementary Note 31

According to another aspect of the present invention, there is provided a process container configured to accommodate a substrate and including an evaporator configured to evaporate a process liquid for processing the substrate.

What is claimed is:

1. A substrate processing apparatus, comprising:
   a pressure-controllable process container configured to accommodate a substrate;
   a substrate support disposed in the process container and supporting the substrate;
   a process liquid supply unit configured to supply a process liquid into the process container;
   an evaporator disposed in the process container and configured to receive the process liquid from the process liquid supply unit, wherein a diameter of the evaporator is greater than a maximum outer diameter of the substrate; and
   a heating unit configured to heat the evaporator to generate a process gas from evaporation of the process liquid within the process container.

2. The substrate processing apparatus of claim 1, further comprising;
   a control unit configured to control the heating unit to heat the evaporator such that the process liquid brought into contact with the evaporator is evaporated in the process container.

3. The substrate processing apparatus of claim 1, wherein the process liquid comprises hydrogen peroxide.

4. The substrate processing apparatus of claim 1, wherein a silicon-containing film is formed on the substrate.

5. The substrate processing apparatus of claim 1, wherein the evaporator is disposed on top of the substrate support.

6. The substrate processing apparatus of claim 2, wherein the process liquid comprises at least two materials having different boiling points, and
   the control unit is configured to control the heating unit in a manner that a concentration of the process liquid before the process liquid is supplied to the process container is equal to that of the process liquid after the process liquid is evaporated.

7. The substrate processing apparatus of claim 1, wherein the process liquid supply unit comprises a plurality of supply holes disposed over the evaporator, the plurality of supply holes being configured to supply the process liquid toward the evaporator.

8. The substrate processing apparatus of claim 7, wherein the heating unit is disposed over the evaporator and the plurality of the supply holes.

9. The substrate processing apparatus of claim 5, wherein the substrate support includes a plurality of props configured to support a plurality of substrates in multiple stages.

10. A method of manufacturing a semiconductor device, comprising:
- loading a substrate on a substrate support disposed in a pressure-controllable process container;
- supplying a process liquid to an evaporator disposed in the process container, wherein a diameter of the evaporator is greater than a maximum outer diameter of the substrate; and
- heating the evaporator to evaporate the process liquid supplied to the evaporator in the process container to generate a process gas within the process container.

11. The method of claim 10, wherein the process liquid comprises hydrogen peroxide.

12. The method of claim 10, wherein a silicon-containing film is formed on the substrate.

13. The method of claim 12, wherein the silicon-containing film comprises polysilazane.

14. A non-transitory computer-readable recording medium storing a program that causes a computer to perform:
- a loading sequence of loading a substrate on a substrate support disposed in a pressure-controllable process container;
- a process liquid supplying sequence of supplying a process liquid to an evaporator disposed in the process container, wherein a diameter of the evaporator is greater than a maximum outer diameter of the substrate; and
- a process liquid heating sequence of heating the evaporator to evaporate the process liquid supplied to the evaporator in the process container to generate a process gas within the process container.

* * * * *